(12) United States Patent
Yamazaki et al.

(10) Patent No.: US 7,897,476 B2
(45) Date of Patent: Mar. 1, 2011

(54) METHOD OF MANUFACTURING SOI SUBSTRATE

(75) Inventors: Shunpei Yamazaki, Setegaya (JP); Eiji Higa, Atsugi (JP); Yoji Nagano, Atsugi (JP); Tatsuya Mizoi, Atsugi (JP); Akihisa Shimomura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 12/078,411

(22) Filed: Mar. 31, 2008

(65) Prior Publication Data

US 2008/0261376 A1    Oct. 23, 2008

(30) Foreign Application Priority Data

Apr. 20, 2007    (JP) ............................. 2007-112140

(51) Int. Cl.
*H01L 21/76* (2006.01)
(52) U.S. Cl. .................. 438/406; 438/149; 438/370; 438/402; 438/407; 438/473; 257/317; 257/318; 257/319; 257/E21.12; 257/E21.563; 257/E21.568
(58) Field of Classification Search .............. 438/149, 438/370, 402, 406, 407, 473; 257/E21.12, 257/317–319, 563, 568
See application file for complete search history.

(56) References Cited

U.S. PATENT DOCUMENTS 5,374,564 A    12/1994   Bruel
6,110,845 A *  8/2000   Seguchi et al. .............. 438/795
6,127,702 A    10/2000  Yamazaki et al.

(Continued)

FOREIGN PATENT DOCUMENTS

JP    11-097379    4/1999

(Continued)

OTHER PUBLICATIONS

Kahlert.H et al., "UV-Optics for Excimer Laser Based Crystallization Processes,", Mat. Res. Soc. Symp. Proc. (Materials Research Society Symposia Proceedings), 2001, vol. 685E, pp. D6.2.1-D6.2.6.

*Primary Examiner*—Charles D Garber
*Assistant Examiner*—Yasser A Abdelaziez
(74) *Attorney, Agent, or Firm*—Eric J. Robinson; Robinson Intellectual Property Law Office, P.C.

(57) ABSTRACT

To provide an SOI substrate with an SOI layer that can be put into practical use, even when a substrate with a low allowable temperature limit such as a glass substrate is used, and to provide a semiconductor substrate formed using such an SOI substrate. In order to bond a single-crystalline semiconductor substrate to a base substrate such as a glass substrate, a silicon oxide film formed by CVD with organic silane as a source material is used as a bonding layer, for example. Accordingly, an SOI substrate with a strong bond portion can be formed even when a substrate with an allowable temperature limit of less than or equal to 700° C. such as a glass substrate is used. A semiconductor layer separated from the single-crystalline semiconductor substrate is irradiated with a laser beam so that the surface of the semiconductor layer is planarized and the crystallinity thereof is recovered.

16 Claims, 21 Drawing Sheets
(1 of 21 Drawing Sheet(s) Filed in Color)

U.S. PATENT DOCUMENTS

| | | |
|---|---|---|
| 6,271,101 B1 | 8/2001 | Fukunaga |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,534,380 B1 * | 3/2003 | Yamauchi et al. ........... 438/455 |
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,927,148 B2 * | 8/2005 | Ito .............................. 438/458 |
| 7,119,365 B2 | 10/2006 | Takafuji et al. |
| 7,148,124 B1 | 12/2006 | Usenko |
| 7,176,525 B2 | 2/2007 | Fukunaga |
| 7,199,024 B2 | 4/2007 | Yamazaki |
| 7,256,776 B2 | 8/2007 | Yamazaki et al. |
| 2004/0038505 A1 | 2/2004 | Ito et al. |
| 2004/0104424 A1 | 6/2004 | Yamazaki |
| 2005/0009252 A1 | 1/2005 | Yamazaki et al. |
| 2005/0042798 A1 | 2/2005 | Nagao et al. |
| 2006/0068563 A1 | 3/2006 | Wong et al. |
| 2007/0063281 A1 | 3/2007 | Takafuji et al. |
| 2007/0108510 A1 | 5/2007 | Fukunaga |
| 2007/0141803 A1 * | 6/2007 | Boussagol et al. .......... 438/455 |
| 2007/0173000 A1 | 7/2007 | Yamazaki |
| 2007/0184632 A1 | 8/2007 | Yamazaki et al. |
| 2007/0238312 A1 * | 10/2007 | Murakami et al. .......... 438/766 |
| 2007/0281172 A1 | 12/2007 | Couillard et al. |
| 2007/0281440 A1 | 12/2007 | Cites et al. |
| 2007/0291022 A1 | 12/2007 | Yamazaki et al. |
| 2008/0286952 A1 | 11/2008 | Miyairi et al. |

FOREIGN PATENT DOCUMENTS

| | | |
|---|---|---|
| JP | 11-163363 | 6/1999 |
| JP | 2004-087606 | 3/2004 |
| JP | 2005-252244 | 9/2005 |

* cited by examiner

FIG. 13A
Before laser irradiation
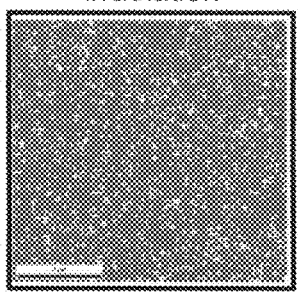
FIG. 13B
Under air
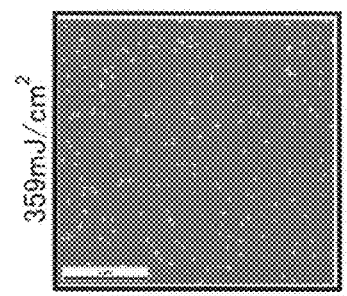
359mJ/cm²
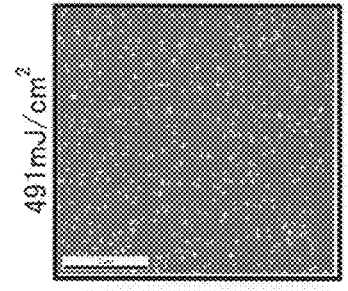
491mJ/cm²
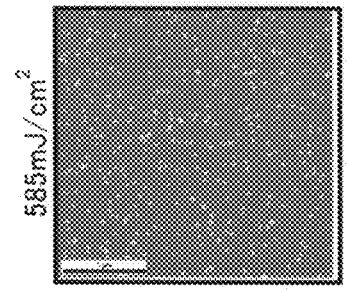
585mJ/cm²
FIG. 13C
Under nitrogen
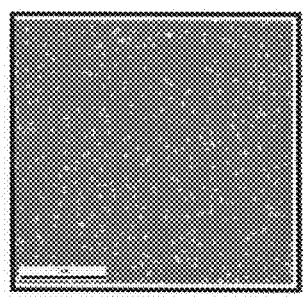
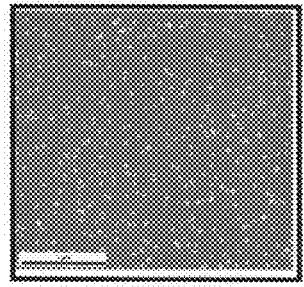
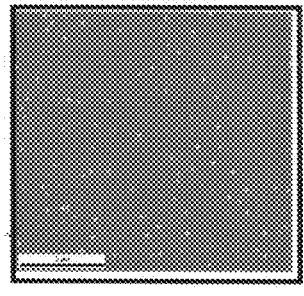
FIG. 13D
Color Coded Map Type: Inverse Pole Figure [001]
Silicon
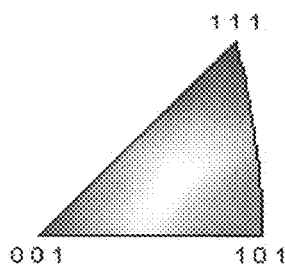

FIG. 15

| Atmosphere during irradiation | Before laser irradiation | Air | Nitrogen | | |
|---|---|---|---|---|---|
| Energy density | | 525mJ/cm² | 431mJ/cm² | 525mJ/cm² | 619mJ/cm² |
| Dark-field images | | | | | |
| AFM images | | | | | |
| Ra[nm] | 7.2 | 1.9 | 5.4 | 2.3 | 1.9 |
| RMS[nm] | 11.5 | 2.5 | 7.0 | 3.0 | 2.8 |
| P-V[nm] | 349.2 | 33.7 | 202.8 | 38.1 | 145.7 |

FIG. 23

| Accelerating voltage | Ratio of hydrogen atom (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD OF MANUFACTURING SOI SUBSTRATE

BACKGROUND OF THE INVENTION

1. Field of the Invention

The present invention relates to an SOI (silicon on insulator) substrate. In addition, the present invention relates to a semiconductor device manufactured using the SOI substrate.

Note that a semiconductor device in this specification refers to all devices that can function by utilizing semiconductor characteristics. For example, electro-optic devices, semiconductor circuits, and electronic devices all fall into the category of a semiconductor device.

2. Description of the Related Art

An integrated circuit that uses a semiconductor substrate called an SOI substrate, which is provided with a thin single-crystalline semiconductor layer on an insulating surface, has been developed, replacing a silicon wafer formed by cutting an ingot of a single-crystalline semiconductor into thin slices. Using an SOI substrate can reduce parasitic capacitance between a drain of a transistor and a substrate. Therefore, the SOI substrate has been drawing attention as a means of improving the performance of a semiconductor integrated circuit.

Among methods of manufacturing SOI substrates, there is known a hydrogen ion delamination method (also called a Smart Cut® method in some cases) (for example, see Reference 1: U.S. Pat. No. 6,372,609). The method of forming an SOI in Reference 1 includes the steps of implanting hydrogen ions into a silicon wafer to form a fine bubble layer at a position of a predetermined depth from the surface, and then bonding the hydrogen-ion-implanted silicon wafer to another silicon wafer with a silicon oxide film interposed therebetween. After that, heat treatment is applied to delaminate the hydrogen-ion-implanted wafer in a thin-film form, with the fine bubble layer used as a cleavage plane. The hydrogen ion delamination method is also called a Smart Cut® method in some cases.

However, a damage layer produced due to the hydrogen ion implantation remains on the surface of the SOI wafer after the delamination. In Reference 1, a method of removing the damage layer is disclosed. In Reference 1, after the delamination step, an oxide film is formed on the surface of the SOI substrate by heat treatment in an oxidizing atmosphere. Then, the oxide film is removed and heat treatment of 1000 to 1300° C. is applied in a reducing atmosphere.

Also, there is known an SOI substrate which is obtained by bonding a silicon layer separated from a silicon wafer to a glass substrate (for example, see Reference 2: Japanese Published Patent Application No. 2004-087606 and Reference 3: Japanese Published Patent Application No. H11-163363).

SUMMARY OF THE INVENTION

It is an object of the present invention to provide an SOI substrate formed using a substrate with a low allowable temperature limit such as a glass substrate which is used in the manufacture of liquid crystal panels. It is another object of the present invention to provide a semiconductor device formed using such an SOI substrate.

In order to manufacture an SOI substrate, a layer that smoothes irregularities of a surface of a semiconductor substrate and has a hydrophilic surface is provided as the bonding layer. As an example of the bonding layer, a silicon oxide film formed by CVD (chemical vapor deposition) using organic silane as a silicon source gas is employed. Examples of an organic silane gas include compounds containing silicon such as tetraethoxysilane (abbreviation: TEOS, chemical formula: $Si(OC_2H_5)_4$), trimethylsilane (TMS: $(CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

The top surface of a semiconductor layer of an SOI substrate has irregularities generated by separation from the semiconductor substrate, and thus has low planarity. Therefore, the top surface is irradiated with a laser beam in order to have improved planarity. By the laser irradiation, irregularities of the top surface of the semiconductor layer generated by separation from the semiconductor substrate can be melted and solidified, so that the top surface of the semiconductor layer can be planarized.

Forming a bonding layer allows the semiconductor layer to be separated from the semiconductor substrate and to be fixed on a base substrate, at a temperature of less than or equal to 700° C. Even if the base substrate is a glass substrate or the like which has an allowable temperature limit of less than or equal to 700° C., an SOI substrate with a strong bonding plane can be formed.

Various glass substrates used in the electronics industry can be employed as the base substrate on which the semiconductor layer is fixed. For example, alkali-free glass such as aluminosilicate glass, aluminoborosilicate glass, or barium borosilicate glass can be used. That is, a single-crystalline semiconductor layer can be formed over a substrate which is over 1 meter on a side. With such a large-area substrate, not only a display device such as a liquid crystal display but also a wide variety of other semiconductor devices can be manufactured.

In addition, the semiconductor layer separated from the semiconductor substrate can be planarized by the laser irradiation. Further, the crystallinity of the semiconductor layer can be recovered by the laser irradiation.

BRIEF DESCRIPTION OF THE DRAWINGS

FIGS. 13A to 13D are IPF maps of single-crystalline silicon layers obtained from EBSP;

FIG. 15 shows observed images of surfaces of single-crystalline silicon layers, which include dark-field images observed with an optical microscope and images observed with an atomic force microscope (AFM images), and also illustrates surface roughness calculated from the AFM images;

FIG. 23 is a list of fitting parameters of the fitting function shown in FIGS. 20 to 22 (hydrogen atom ratios and hydrogen ion species ratios).

The patent or application file contains at least one drawing executed in color. Copies of this patent or patent application publication with color drawing(s) will be provided by the Office upon request and payment of the necessary fee.

DETAILED DESCRIPTION OF THE INVENTION

Embodiment Mode

The present invention will be described hereinafter. Note that it will be easily understood by those skilled in the art that the present invention can be embodied in a wide variety of different ways and, therefore, various modifications and variations can be made to the present invention without departing from the spirit and scope thereof. Thus, the present invention should not be construed as being limited to the description in the following embodiment mode and example.

Figure 1:
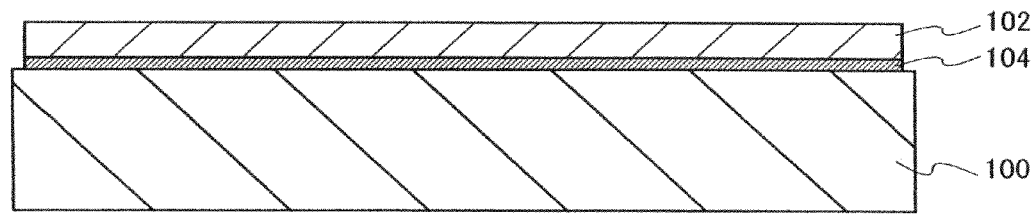
FIG. 1 is a cross-sectional view illustrating the structure of an SOI substrate.

FIG. 1 is a cross-sectional view illustrating an exemplary structure of an SOI substrate. In FIG. 1, reference numeral 100 denotes a base substrate; 102, a semiconductor layer; and 104, a first bonding layer. In the SOI substrate in FIG. 1, the semiconductor layer 102 is fixed to the base substrate 100 by bonding between the first bonding layer 104 and the base substrate 100.

The base substrate 100 can be any of a substrate made of an insulating material, a semiconductor substrate made of a semiconductor material, and a substrate made of a conductive material. The base substrate 100 can be a substrate with an allowable temperature limit of less than or equal to 700° C. Specifically, various glass substrates used in the electronics industry, such as aluminosilicate glass, aluminoborosilicate glass, or barium borosilicate glass can be employed as the base substrate 100. Further, a substrate with an allowable temperature limit of over 700° C. can also be used for the base substrate 100, for example, a quartz substrate, a sapphire substrate, a semiconductor substrate such as a silicon wafer, a ceramic substrate, a stainless steel substrate, a metal substrate, or the like can be used.

The semiconductor layer 102 is a layer formed by being separated from a semiconductor substrate. For the semiconductor substrate, a single-crystalline semiconductor substrate is mostly desirably used, but a polycrystalline semiconductor substrate can also be used. A constituent semiconductor of the semiconductor layer 102 is silicon, silicon-germanium, or germanium. Alternatively, the semiconductor layer 102 can be made of a compound semiconductor such as gallium arsenide or indium phosphide. The thickness of the semiconductor layer 102 can be in the range of from 5 to 500 nm, and is preferably in the range of from 10 to 200 nm.

The first bonding layer 104 is formed between the base substrate 100 and the semiconductor layer 102. The first bonding layer 104 is a layer formed on a surface of a semiconductor substrate which is used for formation of the semiconductor layer 102. The first bonding layer 104 preferably has a hydrophilic property, and a silicon oxide film is suitable for the first bonding layer 104. It is particularly preferable to use a silicon oxide film which is formed by chemical vapor deposition (CVD) using organic silane as a silicon source gas. An oxygen gas ($O_2$ gas) can be used as an oxygen source gas used for formation of the silicon oxide film. Alternatively, the first bonding layer 104 can be formed by depositing a silicon oxynitride film by plasma CVD using at least monosilane and $NO_3$ as a source gas or by depositing a silicon nitride oxide film by plasma CVD using at least monosilane, $NH_3$, and $NO_3$ as a source gas. Further, the first bonding layer 104 can also be formed by depositing aluminum oxide by sputtering or by oxidizing the semiconductor substrate.

The thickness of the first bonding layer 104 is preferably in the range of from 5 to 500 nm. Such a thickness allows the formation of the first bonding layer 104 being capable of forming a bond and having a smooth surface. In addition, such a thickness can ease the distortion of the first bonding layer 104 with the base substrate 100 bonded thereto.

For the organic silane gas, the following compounds containing silicon can be used: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like.

In the SOI substrate in FIG. 1, the base substrate 100 may also be provided with a similar bonding layer to the first bonding layer 104. For example, when silicon oxide, which is deposited by CVD using organic silane as a source material, is used as the material of one of the surfaces being to form a bond, a strong bond can be formed.

Figure 2:
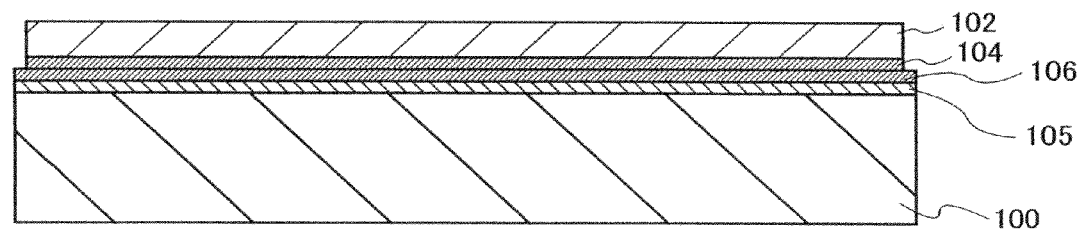
FIG. 2 is a cross-sectional view illustrating the structure of an SOI substrate.

FIG. 2 is a cross-sectional view illustrating an exemplary structure of an SOI substrate. In FIG. 2, reference numeral 100 denotes a base substrate; 102, a semiconductor layer; 104, a first bonding layer; 105, an insulating layer; and 106, a second bonding layer. In the SOI substrate in FIG. 2, the semiconductor layer 102 is fixed to the base substrate 100 by bonding between the first bonding layer 104 and the second bonding layer 106.

The insulating layer 105 is made of a single-layer film or a multi-layer film having a stack of two or more layers. The insulating layer 105 includes at least one insulating film containing nitrogen and silicon, such as a silicon nitride film or a silicon nitride oxide film, which can prevent the semiconductor layer 102 from being contaminated by mobile ion impurities such as alkali metal or alkaline earth metal being to diffuse into the semiconductor layer 102 from the glass substrate used as the base substrate 100. Note that instead of the insulating layer 105, a conductive layer such as metal or a metal compound or a semiconductor layer such as amorphous silicon can also be formed.

The second bonding layer 106 is a film formed over the base substrate 100, and is preferably a film formed from the same material as the first bonding layer, that is a silicon oxide film. For the second bonding layer 106, a silicon oxide film, which is formed by CVD using an organic silane gas as a silicon source gas, can be used similarly to the first bonding layer 104. It is also possible to use a silicon oxide film formed using a different gas from organic silane, as the silicon source gas. Note that the second bonding layer 106 may be formed on the base substrate 100 without forming the insulating layer 105.

In FIG. 2, an insulating film, a semiconductor film, or a conductive film may be formed between the insulating layer 105 and the base substrate 100. Such a film can be either a single-layer film or a multi-layer film. Also, in FIG. 2, an insulating film, a semiconductor film, or a conductive film may be formed between the insulating layer 105 and the second bonding layer 106. Such a film can be either a single-layer film or a multi-layer film.

In FIG. 2, the insulating layer 105 can be omitted. In that case, an insulating film, a semiconductor film, or a conductive film may be formed between the second bonding layer 106 and the base substrate 100. Such a film can be either a single-layer film or a multi-layer film. In addition, in FIG. 2, the second bonding layer 106 can be omitted. In that case, the semiconductor layer 102 is fixed to the base substrate 100 by bonding between the first bonding layer 104 and the insulating layer 105 to each other.

Figure 3:
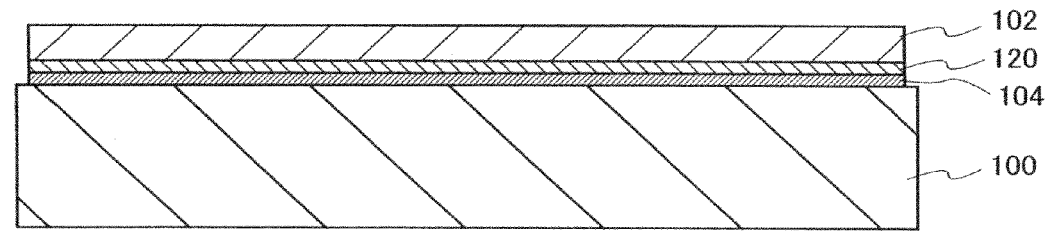
FIG. 3 is a cross-sectional view illustrating the structure of an SOI substrate.

FIG. 3 is a cross-sectional view illustrating an exemplary configuration of an SOI substrate. In FIG. 3, reference numeral 100 denotes a base substrate; 102, a semiconductor layer; 104, a first bonding layer; and 120, an insulating layer. In the SOI substrate in FIG. 3, the semiconductor layer 102 is fixed to the base substrate 100 by bonding between the first bonding layer 104 and the base substrate 100.

The insulating layer 120 is a layer formed on a side of a semiconductor substrate from which the semiconductor layer 102 separated. The semiconductor layer 102 has a single-layer structure or a stacked-layer structure. The insulating layer 120 preferably includes at least one insulating film containing at least nitrogen. Examples of an insulating film containing nitrogen include a silicon nitride film and a silicon nitride oxide film. The formation of a silicon nitride film or a silicon nitride oxide film can prevent impurities such as mobile ions or moisture from diffusing into and contaminating the semiconductor layer 102.

For the insulating layer 120, a film with any of the following structures can be used, for example: a two-layer insulating film obtained by sequentially stacking a silicon oxynitride film and a silicon nitride oxide film over the semiconductor layer 102, a two-layer insulating film obtained by sequentially stacking a silicon oxide film and a silicon nitride oxide film over the semiconductor layer 102, a two-layer insulating film obtained by sequentially stacking a silicon oxide film and a silicon nitride film over the semiconductor layer 102, or a single-layer insulating film made of silicon nitride.

Note that silicon oxynitride means a substance that contains more oxygen than nitrogen. For example, silicon oxynitride includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Also, silicon oxynitride includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means a substance that contains more nitrogen than oxygen. For example, silicon nitride oxide includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively. Also, silicon nitride oxide includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

Next, a method of manufacturing the SOI substrate illustrated in FIG. 1 will be described with reference to FIGS. 4A to 5B. FIGS. 4A to 5B are cross-sectional views for illustrating the method of manufacturing the SOI substrate.

Figure 4A:
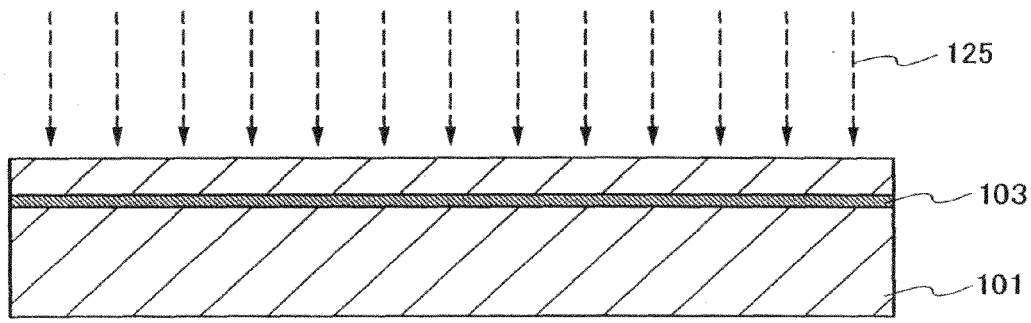
FIGS. 4A to 4C are cross-sectional views illustrating a method of manufacturing an SOI substrate.

As illustrated in FIG. 4A, a semiconductor substrate 101 is prepared. The semiconductor layer 102 is formed from a section of the semiconductor substrate 101. The semiconductor substrate 101 can be a single-crystalline semiconductor substrate. Examples of a single-crystalline semiconductor substrate include a single-crystalline silicon substrate, a single-crystalline silicon-germanium substrate, a single-crystalline germanium substrate, and the like. A polycrystalline semiconductor substrate can also be used instead of the single-crystalline semiconductor substrate. Further, a single-crystalline semiconductor substrate or a polycrystalline semiconductor substrate made of a compound semiconductor such as gallium arsenide or indium phosphide can be used.

First, the semiconductor substrate 101 is cleaned by washing. Next, a source gas is excited (plasma of the source gas is generated) to generate ion species. Then, the ion species generated from the source gas are accelerated with an electric field, producing an ion flux 125. The single-crystalline semiconductor substrate is irradiated with the ion flux 125 as illustrated in FIG. 4A. Ions included in the ion flux 125 are implanted to a region of a predetermined depth from the surface of the semiconductor substrate 101, whereby an ion-implanted layer 103 is formed. The depth at which ions are implanted is determined by taking into account the thickness of the semiconductor layer 102 to be fixed on the base substrate 100. The thickness of the semiconductor layer 102 can be in the range of from 5 to 500 nm, and is preferably in the range of from 10 to 200 nm. The accelerating voltage of the ion flux 125 is controlled by taking into account the thickness of the semiconductor layer 102 so that the ion-implanted layer 103 can be formed at a predetermined depth. This ion implantation process is a process in which an element including ion species is introduced into the semiconductor substrate 101 by irradiating the semiconductor substrate 101 with the ion flux 125 including accelerated ion species. Therefore, the ion-implanted layer 103 is a region to which an element including ion species is introduced. In addition, the ion-implanted layer 103 is also a layer whose crystal structure is lost and weakened by the impact of the accelerated ion species (an embrittlement layer).

In order to implant ions to the semiconductor substrate 101, an ion implantation apparatus, which mass-separates ion species generated from an excited process gas and implants ion species with a predetermined mass, can be used. Alternatively, an ion doping apparatus, which implants all ion species generated from a process gas without mass separation, can be used.

A source gas used for forming the ion-implanted layer 103 can be one or more of a hydrogen gas, a noble gas such as helium or argon, a halogen gas typified by a fluorine gas, and a halogen compound gas such as a fluorine compound gas (for example, $BF_3$).

$H^+$, $H_2^+$, and $H_3^+$ are produced from a hydrogen gas ($H_2$ gas). When a hydrogen gas is used as a source gas, the gas is preferably implanted into the semiconductor substrate 101 such that the semiconductor substrate 101 contains the highest percentage of $H_3^+$. Implanting the $H_3^+$ ions can increase the efficiency of injection and shorten the implantation time. Further, separation of the semiconductor layer from the semiconductor substrate 101 becomes easy. It is easier to generate $H_3^+$ ions from a hydrogen gas with an ion doping apparatus than with an ion implantation apparatus. In the case of using an ion doping apparatus, it is preferable to generate the ion flux 125 in which the percentage of $H_3^+$ ions to the total amount of $H^+$, $H_2^+$, and $H_3^+$ is greater than or equal to 70%, or more preferably greater than or equal to 80%. In order to form the ion-implanted layer 103 in a shallow region, the ion accelerating voltage needs to be set low. However, atomic hydrogen (H) can be efficiently added to the semiconductor substrate 101 by increasing the percentage of $H_3^+$ ions in the plasma that is generated by excitation of the hydrogen gas. This is because, since the mass of an $H_3^+$ ion is three times much as an $H^+$ ion, the accelerating voltage of the $H_3^+$ ion can be tripled compared to that of the $H^+$ ion in the case where one hydrogen atom is added at the same depth. When the ion accelerating voltage can be increased, the tact time of the ion irradiation step can be reduced, whereby productivity and throughput can be improved.

When a noble gas, which is a monatomic gas and is composed of one kind of element, is used as a source gas, ions species with the same mass can be implanted into the semiconductor substrate 101 without mass separation. Therefore, the depth at which the ion-implanted layer 103 is formed can be easily controlled.

In addition, the ion-implanted layer 103 can be formed by conducting a plurality of ion-implantation steps. In that case, either the same process gas or a different process gas may be used in each ion-adding step. Described here is an example in which the ion-implanted layer 103 is formed through two ion-adding steps.

For example, ions are implanted using a noble gas as a source gas. Next, ions are implanted using a hydrogen gas as a process gas. It is also possible to implant ions using a halogen gas or a halogen compound gas and then implant ions using a hydrogen gas. In the case of implanting ion species including fluorine, a $F_2$ gas or a $BF_3$ gas can be used.

In order to form the ion-implanted layer 103, it is necessary to implant ions to the semiconductor substrate 101 with a high dosage condition, but this could result in a rough surface of the semiconductor substrate 101. Therefore, a protective film for protecting the surface of the semiconductor substrate 101 is preferably formed to a thickness of from 50 to 200 nm by depositing a silicon nitride film, a silicon nitride oxide film, or the like on the surface of the semiconductor substrate 101.

Figure 4B:
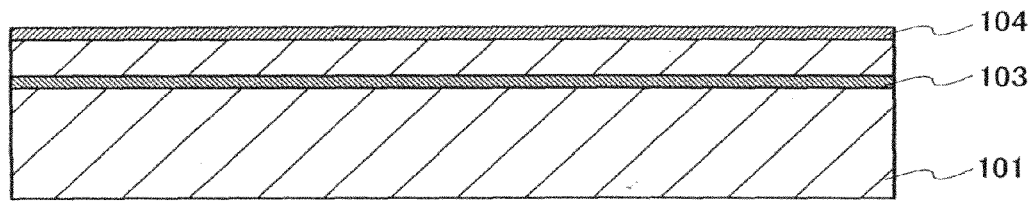

Next, as illustrated in FIG. 4B, the first bonding layer 104 is formed on a surface to be bonded to the base substrate 100. Here, a silicon oxide film is formed as the first bonding layer 104. The silicon oxide film is preferably formed by CVD using an organic silane gas as a silicon source gas. Examples of a silicon source gas include $SiH_4$, $Si_2H_6$, $SiCl_4$, $SiHCL_3$, $SiH_2Cl_2$, $SiH_3Cl_3$, and $SiF_4$ as well the organic silane gas. As an oxygen source gas for forming this silicon oxide film, an oxygen gas can be used. In addition, the CVD can be either plasma CVD or low-pressure CVD.

In the step of forming the first bonding layer 104, the heating temperature of the semiconductor substrate 101 is preferably a temperature at which an element or a molecule that has been implanted to the ion-implanted layer 103 does not escape, that is a temperature at which gas does not escape of the ion-implanted layer 103. The heating temperature is preferably less than or equal to 350° C. Therefore, plasma CVD is preferably used for forming the first bonding layer 104. Note that the heat treatment temperature for separating the semiconductor layer from the semiconductor substrate 101 is higher than the deposition temperature of the first bonding layer 104.

In the case of forming the SOI substrate in FIG. 3, the insulating layer 120 is formed before the formation of the first bonding layer 104. For example, in order to form a silicon nitride film, plasma CVD may be performed using $SiH_4$ and $NH_3$ as a process gas. In addition, in order to form a silicon oxynitride film or a silicon oxide film, plasma CVD may be performed using $SiH_4$ and $N_2O$ as a process gas. Further, when the semiconductor substrate 101 is a silicon substrate, a silicon nitride film (or a silicon oxide film) can be formed by nitriding (or oxidizing) the semiconductor substrate 101. In that case, by nitriding and oxidizing the semiconductor substrate 101, a silicon nitride oxide film or a silicon oxynitride film can be formed.

The insulating layer 120 can be formed before or after the formation of the ion-implanted layer 103. When the heating temperature required for forming the insulating layer 120 is a temperature at which gas could escape of the ion-implanted layer 103, the insulating layer 120 is formed before the formation of the ion-implanted layer 103.

Figure 4C:
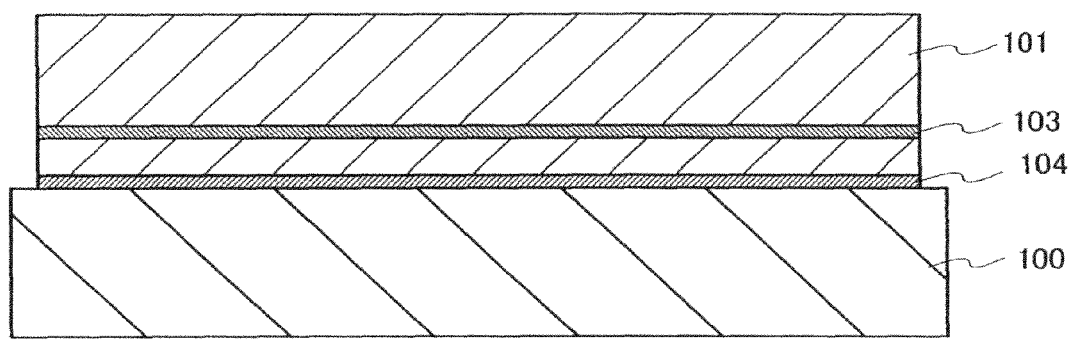

FIG. 4C is a cross-sectional view illustrating the step of bonding the base substrate 100 and the first bonding layer 104 to each other by bringing the base substrate 100 and the semiconductor substrate 101, which has the first bonding layer 104 formed on its surface, into close contact with each other. First, surfaces of the base substrate 100 and the first bonding layer 104 that will form a bonding interface are washed by ultrasonic cleaning or the like. Then, the base substrate 100 and the first bonding layer 104 are brought into close contact with each other, so that van der Waals force acts on the interface between the base substrate 100 and the first bonding layer 104, and thus the base substrate 100 and the first bonding layer 104 are bonded to each other. By bringing the base substrate 100 and the semiconductor substrate 101 into close contact with each other and applying pressure to the bonding interface therebetween, hydrogen bonds are formed at the bonding interface, increasing the bonding strength between the first bonding layer 104 and the base substrate 100. When a silicon oxide film formed by CVD with organic silane is used for the first bonding layer 104, the base substrate 100 and the first bonding layer 104 can be bonded to each other at room temperature without heating the base substrate 100 or the semiconductor substrate 101.

In order to form a good bond, at least one of the surfaces of the base substrate 100 and the first bonding layer 104 may be activated before they are bonded to each other. In order to activate the surface, the surface at which a bonding interface is to be formed is irradiated with an atom beam or an ion beam. In that case, it is preferable to generate a neutral atom beam or an ion beam from an inert gas such as argon. As an alternative method of activation treatment, plasma treatment or radical treatment may also be applied.

After the base substrate 100 and the first bonding layer 104 are brought into close contact with each other, heat treatment or pressurization treatment can be applied. Applying the heat treatment or pressurization treatment can increase the bonding strength. The temperature of the heat treatment is preferably less than or equal to the allowable temperature limit of the base substrate 100. The pressurization treatment is performed such that stress is applied in a direction perpendicular to the bonding plane, and the pressure applied is determined based on the strengths of the base substrate 100 and the semiconductor substrate 101.

Figure 5A:
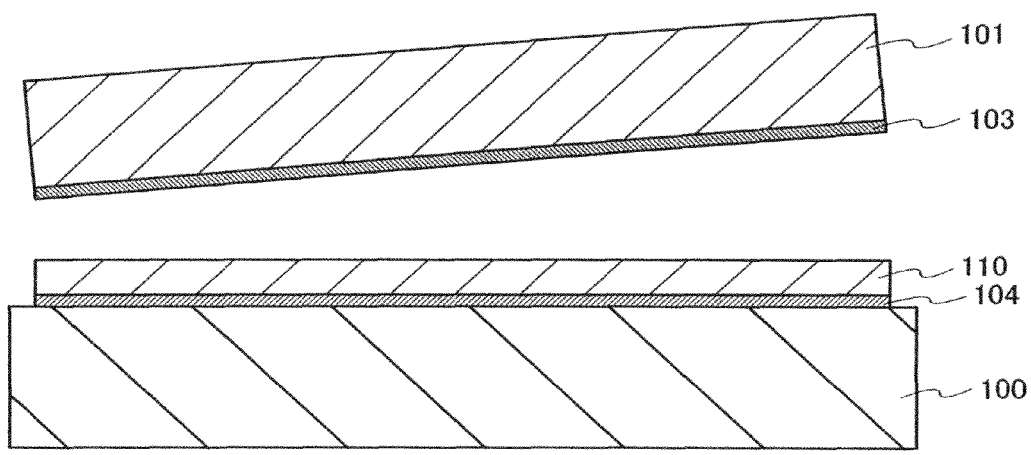
FIGS. 5A and 5B are cross-sectional views illustrating a method of manufacturing an SOI substrate.

FIG. 5A is a cross-sectional view for illustrating the step of separating a semiconductor layer from the semiconductor substrate 101. First, after bonding the base substrate 100 and the first bonding layer 104 to each other, heat treatment for heating the semiconductor substrate 101 is applied. By this heat treatment, the volume of minute cavities that are formed in the ion-implanted layer 103 changes, whereby a crack is generated in the ion-implanted layer 103. Therefore, by applying stress to the semiconductor substrate 101, the semiconductor substrate 101 is cleaved along the ion-implanted layer 103, whereby the semiconductor substrate 101 is separated from the base substrate 100. Accordingly, after the semiconductor substrate 101 is separated from the base substrate 100, a semiconductor layer 110 which is separated from the semiconductor substrate 101 remains fixed on the base substrate 100.

The heat treatment is preferably performed at a temperature of greater than or equal to the deposition temperature of the first bonding layer 104 and a temperature of less than or equal to the allowable temperature limit of the base substrate 100. A heating temperature ranging from 400 to 600° C. can generate a crack in the ion-implanted layer 103. Therefore, a substrate with a low allowable temperature limit such as a glass substrate can be used for the base substrate 100.

In addition, since the bonding interface between the base substrate 100 and the first bonding layer 104 is heated by this heat treatment, covalent bonds are formed at the bonding interface, and bonding strength at the bonding interface can be increased.

Figure 5B:
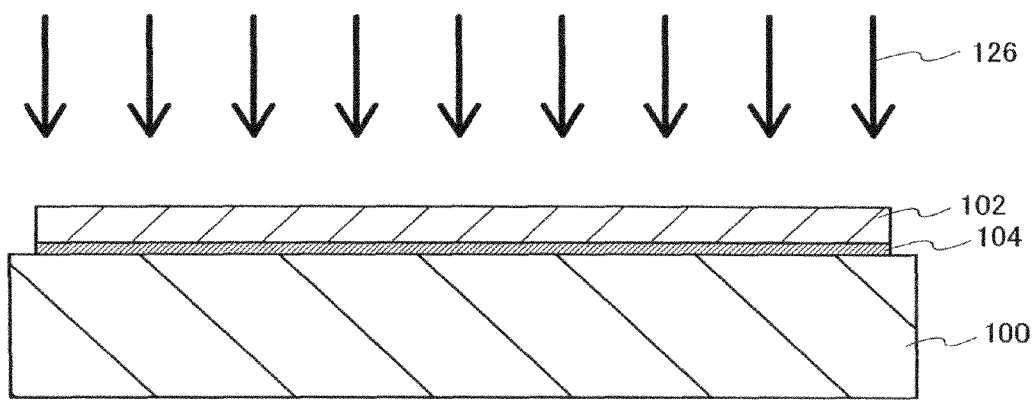

In FIG. 5A, the top surface of the semiconductor layer 110 is a surface on which the ion-implanted layer 103 has cracked. Therefore, the planarity of the top surface of the semiconductor layer 110 is lower than that of the top surface of the semiconductor substrate 101 before separated, and thus irregularities are formed. Therefore, in order to restore the planarity of the top surface of the semiconductor layer 110, the semiconductor layer 110 is irradiated with a laser beam from above. This laser irradiation can also recover the crystallinity of the semiconductor layer 110. FIG. 5B is a cross-sectional view illustrating a laser irradiation step.

As illustrated in FIG. 5B, the semiconductor layer 110 is irradiated with a laser beam 126 from above. Irradiation with the laser beam 126 melts the semiconductor layer 110. When the melted portion is cooled and solidified, a semiconductor layer 102 with improved planarity and crystallinity is formed. Since the semiconductor layer 110 is heated by the laser irradiation, a substrate with a low allowable temperature limit such as a glass substrate can be used for the base substrate 100.

The irradiation with the laser beam 126 can either partially or completely melt the semiconductor layer 110. Note that a state in which the semiconductor layer 110 is completely melted means, referring to the structure of FIG. 5B as an example, a state in which a region of the semiconductor layer 110 from its top surface to the interface between the semiconductor layer 110 and the first bonding layer 104 is melted and the melted portion is totally liquefied. Meanwhile, a state in which the semiconductor layer 102 is partially melted means a state in which a region of the semiconductor layer 102 from its top surface to a predetermined depth is melted whereas a solid portion in the other region remains. When the semiconductor layer 110 is completely melted by the irradiation with the laser beam 126, planarization progresses due to the surface tension of the semiconductor having a liquid phase, and thus the semiconductor layer 102 with a planarized surface is formed. In addition, while the completely melted region of the semiconductor layer 110 is being solidified, lateral growth occurs in which crystals of a solid-phase semiconductor in a region adjacent to the melted region grow in a lateral direction. When the semiconductor substrate 101 is a single-crystalline semiconductor substrate, the unmelted portion is a single-crystalline semiconductor and has uniform crystal orientation. Therefore, crystal grain boundaries are not formed, and the semiconductor layer 102 obtained through laser irradiation is a single-crystalline semiconductor layer without crystal grain boundaries. In addition, when the semiconductor layer 110 is partially melted by the irradiation with the laser beam 126, planarization progresses by the surface tension of the semiconductor having a liquid phase. At the same time, the liquid-phase portion starts to be cooled by diffusion of heat, so that the semiconductor layer 110 has a temperature gradient in a depth direction. Then, a solid-liquid interface moves from the base substrate 100 side to the surface of the semiconductor layer 110, whereby the semiconductor layer 110 is recrystallized. That is, when the semiconductor layer 110 is partially melted, recrystallization progresses starting from the unmelted region of the lower portion, and thus crystals grow in a longitudinal direction. When a single-crystalline silicon wafer having a main surface with a surface orientation of (100) is used as the semiconductor substrate 101, the semiconductor layer 110 before subjected to laser irradiation is a single-crystalline silicon layer having a main surface with a surface orientation of (100). In addition, the semiconductor layer 102 obtained by recrystallization of the semiconductor layer 110 by partially or completely melting the semiconductor layer 110 through laser irradiation is a single-crystalline silicon layer having a main surface with a surface orientation of (100). That is, when a single-crystalline semiconductor substrate is used, the laser irradiation step can serve as a planarization step and a recrystallization step.

A laser oscillator that emits the laser beam 126 can be any of a continuous wave laser, a pseudo-continuous wave laser, and a pulsed laser. Examples of lasers that are used in the present invention include excimer lasers such as a KrF laser and gas lasers such as an Ar laser and a Kr laser. Further, the following solid-state lasers can be used: a YAG laser, a YVO$_4$ laser, a YLF laser, a YAlO$_3$ laser, a GdVO$_4$ laser, a KGW laser, a KYW laser, an alexandrite laser, a Ti:sapphire laser, a Y$_2$O$_3$ laser, and the like. Although an excimer laser is a pulsed laser, a solid-state laser such as a YAG laser can be used as any of a continuous wave laser, a pseudo-continuous wave laser, and a pulsed laser.

The wavelength of the laser beam is a wavelength absorbed by the semiconductor layer 110, and can be determined based on the skin depth of the laser beam, the thickness of the semiconductor layer 110, and the like. For example, the wavelength can be in the range of from 250 to 700 nm. In addition, the energy of the laser beam can also be determined based on the wavelength of the laser beam, the skin depth of the laser beam, the thickness of the semiconductor layer 110, and the like. The present inventors have confirmed that the planarity and crystallinity of the semiconductor layer 110 can be improved by forming the semiconductor layer 110 to a thickness of about 170 nm, using a KrF excimer laser for the laser, and controlling the energy density of the laser beam to be within the range of from 300 to 750 mJ/cm$^2$. In order to analyze the planarity and crystallinity of the semiconductor layer 110, observation with an optical microscope, an AFM (atomic force microscope), and a SEM (scanning electron microscope), observation of EBSP (electron back scatter diffraction patterns), and Raman spectroscopy were conducted. In addition, laser irradiation was conducted in the atmospheric air including oxygen or in a nitrogen atmosphere not including oxygen. The planarity and crystallinity of the semiconductor layer 110 are improved both in the atmospheric air and in the nitrogen atmosphere. Note that the planarity can be improved more effectively in the nitrogen atmosphere than in the atmospheric air, and also generation of cracks can be suppressed more effectively in the nitrogen atmosphere than in the atmospheric air.

It is also possible to fix a plurality of semiconductor layers 102 on one base substrate 100. For example, the steps described with reference to FIGS. 4A to 4C are repeated a plurality of times so that a plurality of semiconductor substrates 101 are fixed to the base substrate 100. Then, the heat treatment described with reference to FIG. 5A is applied to separate each semiconductor substrate 101, whereby the plurality of semiconductor layers 110 can be fixed to the base substrate 100. Next, the laser irradiation step illustrated in FIG. 5B is applied, so that the plurality of semiconductor layers 110 are planarized to form a plurality of semiconductor layers 102.

Figure 6A:
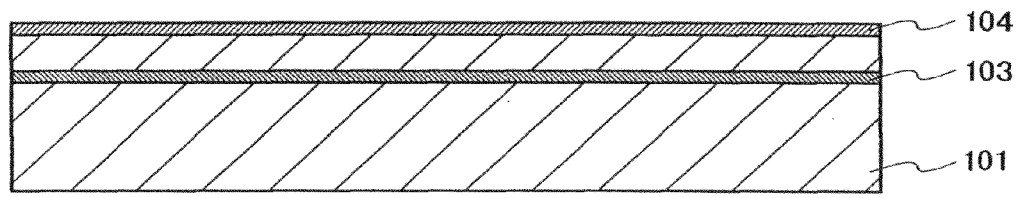
FIGS. 6A to 6C are cross-sectional views illustrating a method of manufacturing an SOI substrate.

Next, a method of manufacturing the SOI substrate illustrated in FIG. 2 will be described. First, the steps described with reference to FIGS. 4A and 4B are conducted, so that the ion-implanted layer 103 is formed at a position of a predetermined depth from the top surface of the semiconductor substrate 101 as illustrated in FIG. 6A. Then, the first bonding layer 104 is formed on the top surface of the semiconductor substrate 101.

Figure 6B:
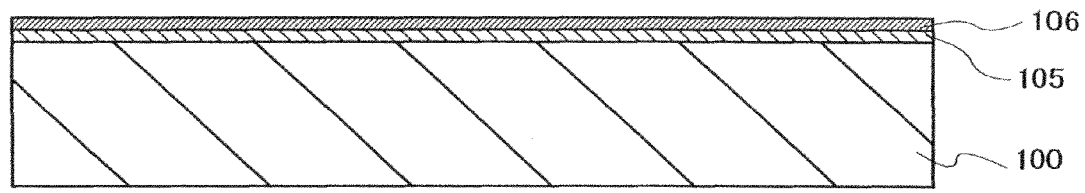

FIG. 6B is a cross-sectional view of the base substrate 100. First, the insulating layer 105 is formed on the top surface of the base substrate 100 as illustrated in FIG. 6B. In order to form a silicon nitride film, for example, plasma CVD may be performed using $SiH_4$ and $NH_3$ as a process gas. Alternatively, $SiH_4$, $N_2$, and Ar can be used as the process gas. In addition, in order to form a silicon oxynitride film or a silicon oxide film, plasma CVD may be performed using $SiH_4$ and $N_2O$ as a process gas.

Next, the second bonding layer 106 is formed on the insulating layer 105. A silicon oxide film is formed as the second bonding layer 106. When the second bonding layer 106 is formed using a silicon oxide film which is formed by CVD using an organic silane gas as a silicon source gas, the deposition method of the first bonding layer 104 can be other than the CVD using an organic silane gas as a silicon source gas. When the semiconductor substrate 101 is a silicon substrate, the first bonding layer 104 can be formed using a thermal oxide film formed by thermal oxidation. Instead of the thermal oxide film, a chemical oxide layer formed by chemical oxidation can also be used. Chemical oxide can be formed by, for example, treating the surface of the silicon substrate with water containing ozone. Since the chemical oxide layer has about the same planarity as the silicon substrate, it is preferable as a bonding layer.

Figure 6C:
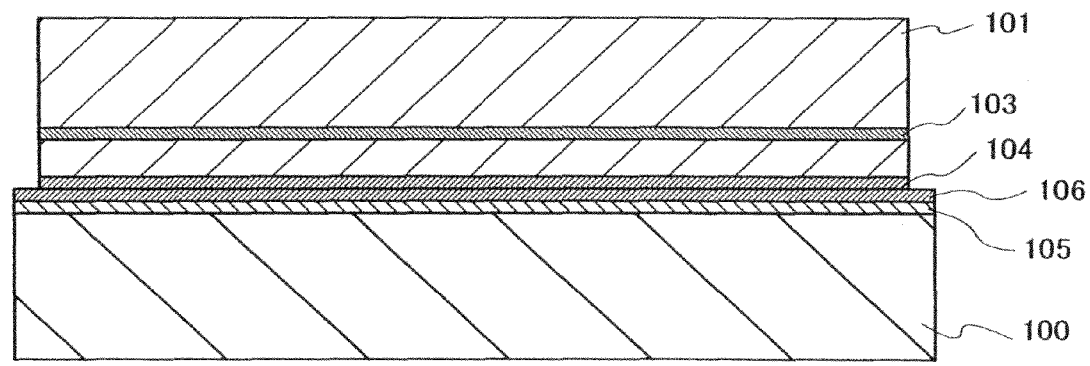

FIG. 6C is a cross-sectional view illustrating the step of bonding the second bonding layer 106 and the first bonding layer 104 to each other by bringing the base substrate 100 and the semiconductor substrate 101, which has the first bonding layer 104 formed on its surface, into close contact with each other. The first bonding layer 104 and the second bonding layer 106 are bonded to each other through a similar bonding step to that described with reference to FIG. 4C. When a silicon oxide film formed by CVD with organic silane is used for at least one of the first bonding layer 104 and the second bonding layer 106, the first bonding layer 104 and the second bonding layer 106 can be bonded to each other at room temperature without heating the base substrate 100 or the semiconductor substrate 101.

At least one of the surfaces of the first bonding layer 104 and the second bonding layer 106 is preferably activated before they are brought into close contact with each other. The activation may be performed by irradiation with a neutral atom beam of an inert gas such as argon or with an ion beam of an inert gas. Alternatively, plasma treatment or radical treatment can be performed.

After the first bonding layer 104 and the second bonding layer 106 are brought into close contact with each other, heat treatment or pressurization treatment can be applied. Applying the heat treatment or pressurization treatment can increase the bonding strength between the first bonding layer 104 and the second bonding layer 106. The temperature of the heat treatment is preferably less than or equal to the allowable temperature limit of the base substrate 100. The pressurization treatment is performed such that stress is applied in a direction perpendicular to a bonding interface, and the pressure applied is determined based on the strengths of the base substrate 100 and the semiconductor substrate 101.

Figure 7A:
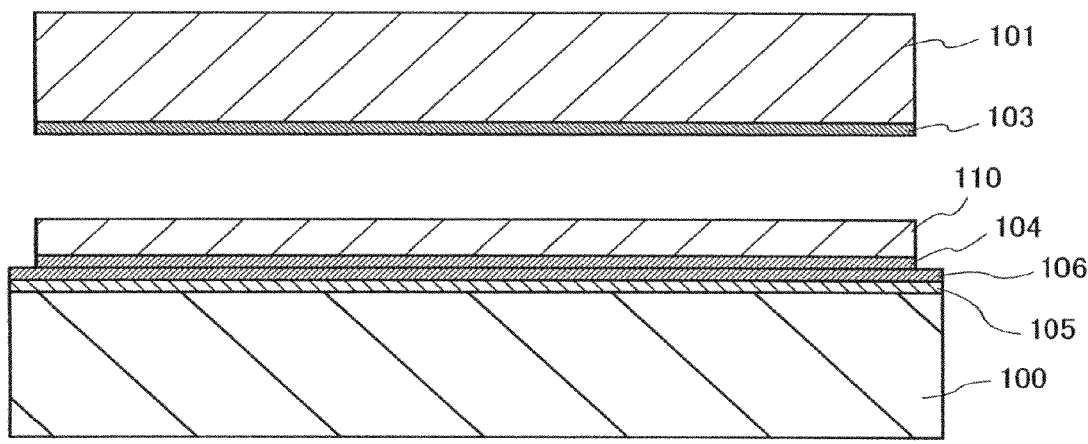
FIGS. 7A and 7B are cross-sectional views illustrating a method of manufacturing an SOI substrate.

FIG. 7A is a cross-sectional view for illustrating the step of separating a semiconductor layer from the semiconductor substrate 101. Heat treatment is applied to generate a crack in the ion-implanted layer 103, similarly to the heat treatment described with reference to FIG. 5A. The bonding interface between the first bonding layer 104 and the second bonding layer 106 is heated by this heat treatment. Therefore, covalent bonds are formed at the bonding interface, and bonding strength at the bonding interface can be increased. By generating a crack in the ion-implanted layer 103, the semiconductor substrate 101 is cleaved along the ion-implanted layer 103, whereby the semiconductor substrate 101 and the base substrate 100 can be separated from each other. As a result, an SOI substrate is formed as illustrated in FIG. 7A in which the semiconductor layer 110 separated from the semiconductor substrate 101 is fixed on the base substrate 100.

Figure 7B:
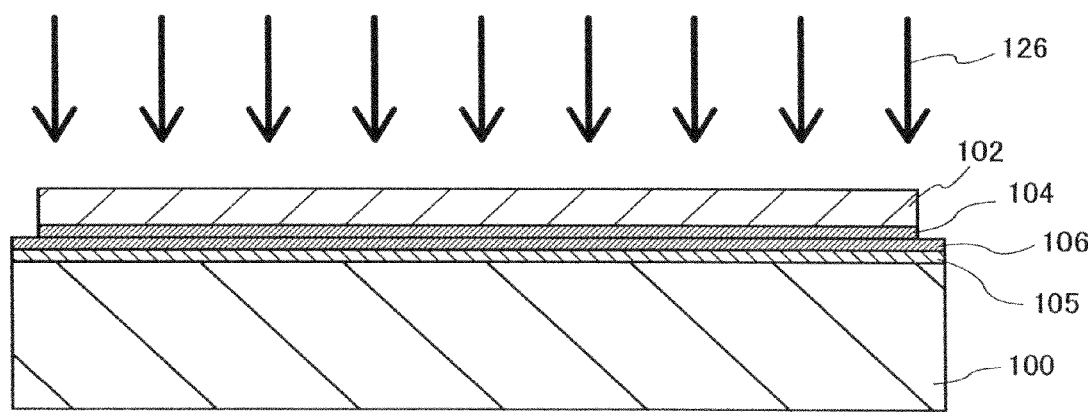

FIG. 7B is a cross-sectional view for illustrating the step of irradiating the SOI substrate with a laser beam. After the semiconductor substrate 101 is separated, the semiconductor layer 110 is irradiated with a laser beam 126 from above as in the laser irradiation step described with reference to FIG. 5B, so that the semiconductor layer 102 with a planarized surface and improved crystallinity is formed.

It is also possible to fix a plurality of semiconductor layers 102 on one base substrate 100. For example, the steps described with reference to FIGS. 6A to 6C are repeated a plurality of times so that a plurality of semiconductor substrates 101 are fixed to the base substrate 100. Then, the heating step described with reference to FIG. 6A is applied to separate each semiconductor substrate 101, whereby a plurality of semiconductor layers 110 can be fixed to the base substrate 100. Next, the laser irradiation step illustrated in FIG. 7B is applied, so that the plurality of semiconductor layers 110 are planarized to form a plurality of semiconductor layers 102.

In the methods of manufacturing the SOI substrates described with reference to FIGS. 4A to 7B, the bonding strength between the semiconductor layer 102 and the base substrate 100 can be firm even when the base substrate is a glass substrate or the like having an allowable temperature limit of less than or equal to 700° C. For the base substrate 100, various glass substrates used in the electronics industry can be employed, for example, alkali-free glass such as aluminosilicate glass, aluminoborosilicate glass, or barium borosilicate glass. That is, the single-crystalline semiconductor layer can be formed over a substrate which is over 1 meter on a side. With such a large-area substrate, a liquid crystal display or an electroluminescence display can be manufactured. In addition, not only such a display device, but also a semiconductor integrated circuit can be manufactured.

Hereinafter, a method of manufacturing a semiconductor device using an SOI substrate will be described with reference to FIGS. 8A to 9B. Although an SOI substrate with the same structure as the SOI substrate in FIG. 1 is used here, an SOI substrate with a different structure can also be used.

Figure 8A:
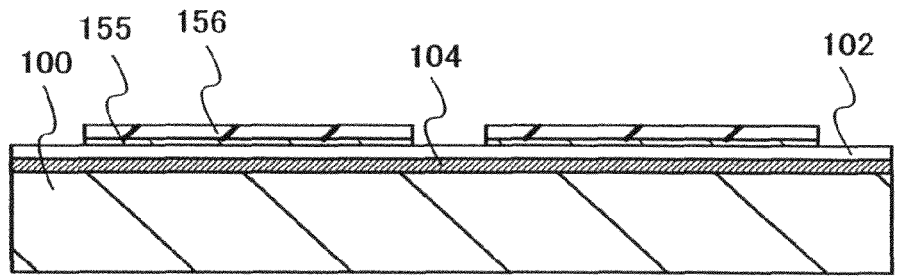
FIGS. 8A to 8E are cross-sectional views illustrating a method of manufacturing a semiconductor device using an SOI substrate.

As illustrated in FIG. 8A, the semiconductor layer 102 is provided over the base substrate 100 with the first bonding layer 104 interposed therebetween. First, a silicon nitride layer 155 and a silicon oxide layer 156 are formed in a region corresponding to each element formation region. The silicon oxide layer 156 is used as a hard mask in etching the semiconductor layer 102 for element isolation. The silicon nitride layer 155 is used as an etching stopper in etching the semiconductor layer 102. In order to control the threshold voltage, the semiconductor layer 102 is implanted with a p-type impurity such as boron, aluminum, or gallium or an n-type impurity such as arsenic or phosphorus. When boron is used as a p-type impurity, for example, the doping may be controlled such that the semiconductor layer 102 contains boron at a concentration of less than or equal to $5 \times 10^{17}$ to $1 \times 10^{18}$ cm$^{-3}$.

Figure 8B:
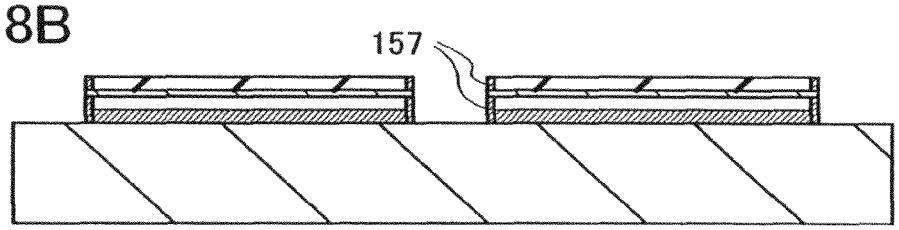

FIG. 8B is a cross-sectional view for illustrating the step of etching the semiconductor layer 102 and the first bonding layer 104 with the silicon oxide layer 156 as a mask. Exposed end faces of the semiconductor layer 102 and the first bonding layer 104 are nitrided by plasma treatment. This nitridation treatment forms silicon nitride layers 157 on at least peripheral end portions of the semiconductor layer 102. Silicon nitride has an insulating property as well as oxidation resistance. Therefore, formation of the silicon nitride layers 157 can prevent leakage current from the end faces of the semiconductor layer 102 as well as growth of an oxide film on the end faces, which could otherwise produce a bird's beak between the semiconductor layer 102 and the first bonding layer 104.

Figure 8C:
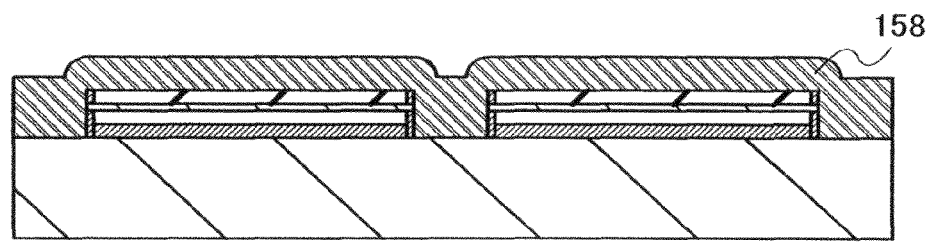

FIG. 8C is a cross-sectional view for illustrating the step of depositing an element-isolation insulating layer 158. The element-isolation insulating layer 158 is formed by depositing a silicon oxide film by CVD using TEOS and oxygen. As illustrated in FIG. 8C, the element-isolation insulating layer 158 is deposited to be thick so as to fill a space between the adjacent semiconductor layers 102.

Figure 8D:
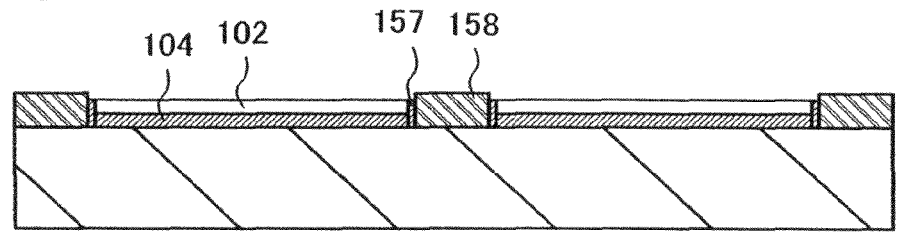

FIG. 8D illustrates the step of partially removing the element-isolation insulating layer 158 to a depth at which the silicon nitride layer 155 is exposed. This removing step can be performed by dry etching or chemical mechanical polishing. The silicon nitride layer 155 serves as an etching stopper. The element-isolation insulating layer 158 partially remains so as to fill the space between the adjacent semiconductor layers 102. After that, the silicon nitride layer 155 is removed.

Figure 8E:
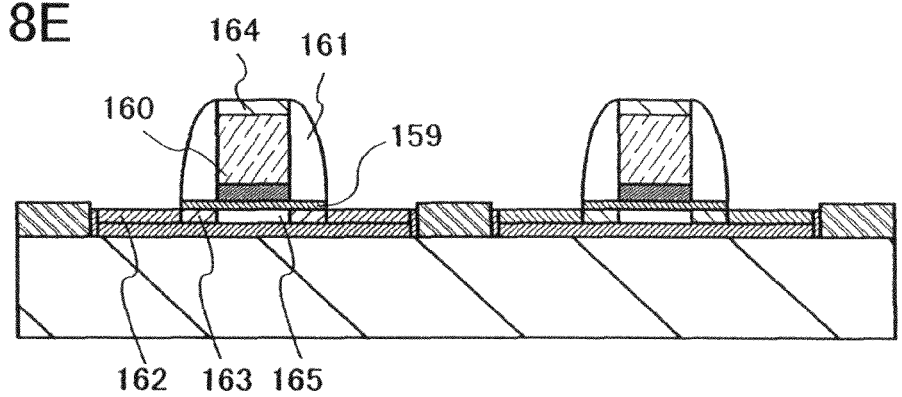

Next, as illustrated in FIG. 8E, a gate insulating layer 159, a gate electrode 160 with a two-layer structure, sidewall insulating layers 161, first impurity regions 162, second impurity regions 163, and an insulating layer 164 are formed. By forming the first impurity regions 162 and the second impurity regions 163 in the semiconductor layer 102, a channel formation region 165 is formed. The insulating layer 164 is formed with silicon nitride and is used as a hard mask for etching the gate electrode 160.

Figure 9A:
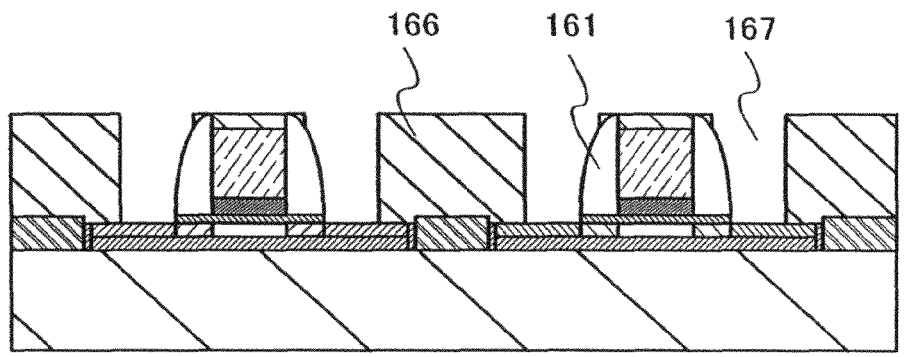
FIGS. 9A and 9B are cross-sectional views illustrating a method of manufacturing a semiconductor device using an SOI substrate.

Next, as illustrated in FIG. 9A, an interlayer insulating layer 166 is formed. The interlayer insulating layer 166 is formed by depositing BPSG (borophosphosilicate glass) and planarizing it through reflowing. Alternatively, the interlayer insulating layer 166 may be formed by depositing a silicon oxide film using TEOS and planarizing it through chemical mechanical polishing. In the planarization treatment, the insulating layer 164 above the gate electrode 160 serves as an etching stopper. Contact holes 167 are formed in the interlayer insulating layer 166. The contact holes 167 each have a self-aligned contact structure which is formed by use of the sidewall insulating layer 161.

Figure 9B:
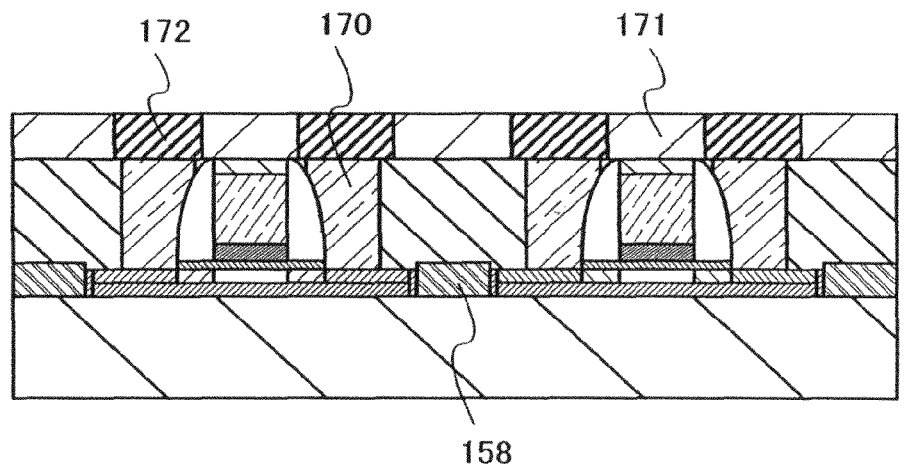

Next, as illustrated in FIG. 9B, contact plugs 170 are formed by CVD using tungsten hexafluoride. Further, an insulating layer 171 is formed and openings are formed in positions above the contact plugs 170. Then, wirings 172 are provided in the openings. The wirings 172 are formed with aluminum or an aluminum alloy. Specifically, the wirings 172 are each formed with a metal film which has a barrier metal such as molybdenum, chromium, or titanium as each of top and bottom layers.

In this manner, a field-effect transistor can be fabricated using the semiconductor layer 102 bonded to the base substrate 100. Since the semiconductor layer 102 in accordance with this embodiment mode is a single-crystalline semiconductor having uniform crystal orientation, field-effect transistors with uniform characteristics and high performance can be provided. That is, it is possible to suppress variations in threshold voltage, mobility, and the like that are the important characteristics of transistors and also to achieve high performance such as a decrease in threshold voltage and an improvement in mobility.

In addition, since the semiconductor layer 102 is irradiated with a laser beam so that the planarity of the surface of the semiconductor layer 102 is improved, the interface state density between the channel formation region and the gate insulating layer of the field-effect transistor can be lowered. Therefore, a field-effect transistor with excellent characteristics such as low driving voltage, high field-effect mobility, and small subthreshold swing can be formed.

Semiconductor devices for various uses can be manufactured using the field-effect transistors described with reference to FIGS. 8A to 9B. Hereinafter, specific examples of semiconductor devices will be described with reference to the drawings.

Figure 10:
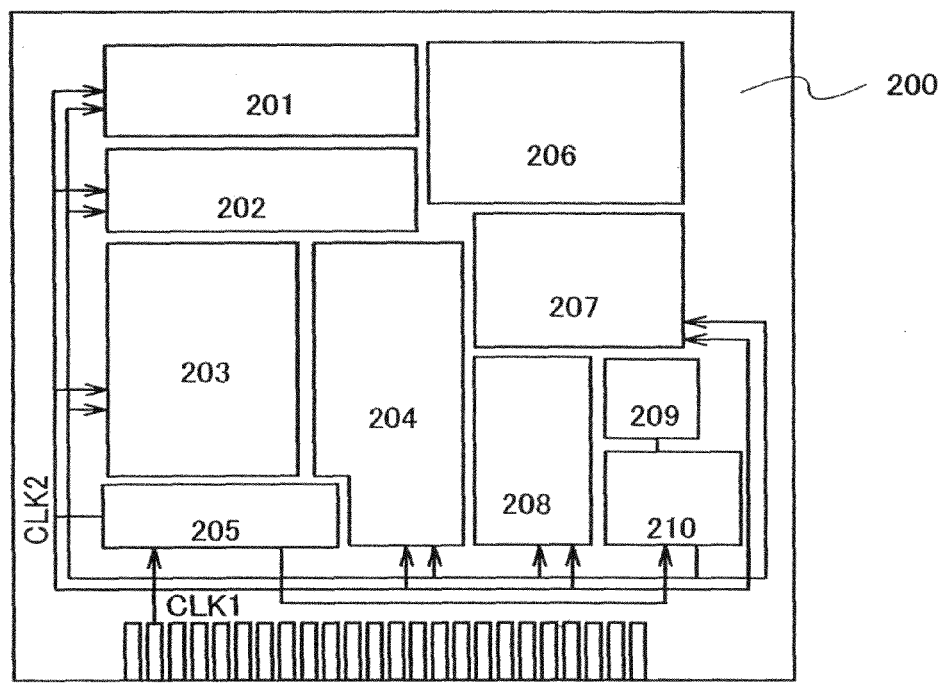
FIG. 10 is a block diagram illustrating the configuration of a microprocessor manufactured using an SOI substrate.

First, a microprocessor will be described as an example of a semiconductor device. FIG. 10 is a block diagram illustrating an exemplary configuration of a microprocessor 200. This microprocessor 200 is manufactured using the SOI substrate in accordance with this embodiment mode as described above.

The microprocessor 200 includes an arithmetic logic unit (also referred to as an ALU) 201, an arithmetic logic unit controller (ALU controller) 202, an instruction decoder 203, an interrupt controller 204, a timing controller 205, a register 206, a register controller 207, a bus interface (bus I/F) 208, a read-only memory (ROM) 209, and a ROM interface (ROM I/F) 210.

An instruction input to the microprocessor 200 through the bus interface 208 is input to and decoded by the instruction decoder 203, and then input to the ALU controller 202, the interrupt controller 204, the register controller 207, and the timing controller 205. Each of the ALU controller 202, the interrupt controller 204, the register controller 207, and the timing controller 205 performs various control operations based on the decoded instruction.

Specifically, the ALU controller 202 generates signals for controlling the operation of the ALU 201. While the microprocessor 200 is executing a program, the interrupt controller 204 processes an interrupt request from an external input/output device or a peripheral circuit based on the priority of the request or a mask state. The register controller 207 generates an address of the register 206 and performs reading or writing data from/to the register 206 based on the state of the microprocessor 200. The timing controller 205 generates signals for controlling the operation timing of the ALU 201, the ALU controller 202, the instruction decoder 203, the interrupt controller 204, and the register controller 207.

For example, the timing controller 205 has an internal clock generator which generates an internal clock signal CLK 2 based on a reference clock signal CLK1, and supplies the internal clock signal CLK 2 to the various circuits described above. Note that the configuration of the microprocessor 200 illustrated in FIG. 10 is just a simplified example and, in practice, the microprocessor 200 can have a wide variety of configurations depending on its use.

Since the above-described microprocessor 200 has an integrated circuit formed from a single-crystalline semiconductor layer with uniform crystal orientation (an SOI layer) that is bonded to a substrate with an insulating surface or an insulating substrate, not only an increase in processing speed but also a reduction in power consumption can be achieved.

Figure 11:
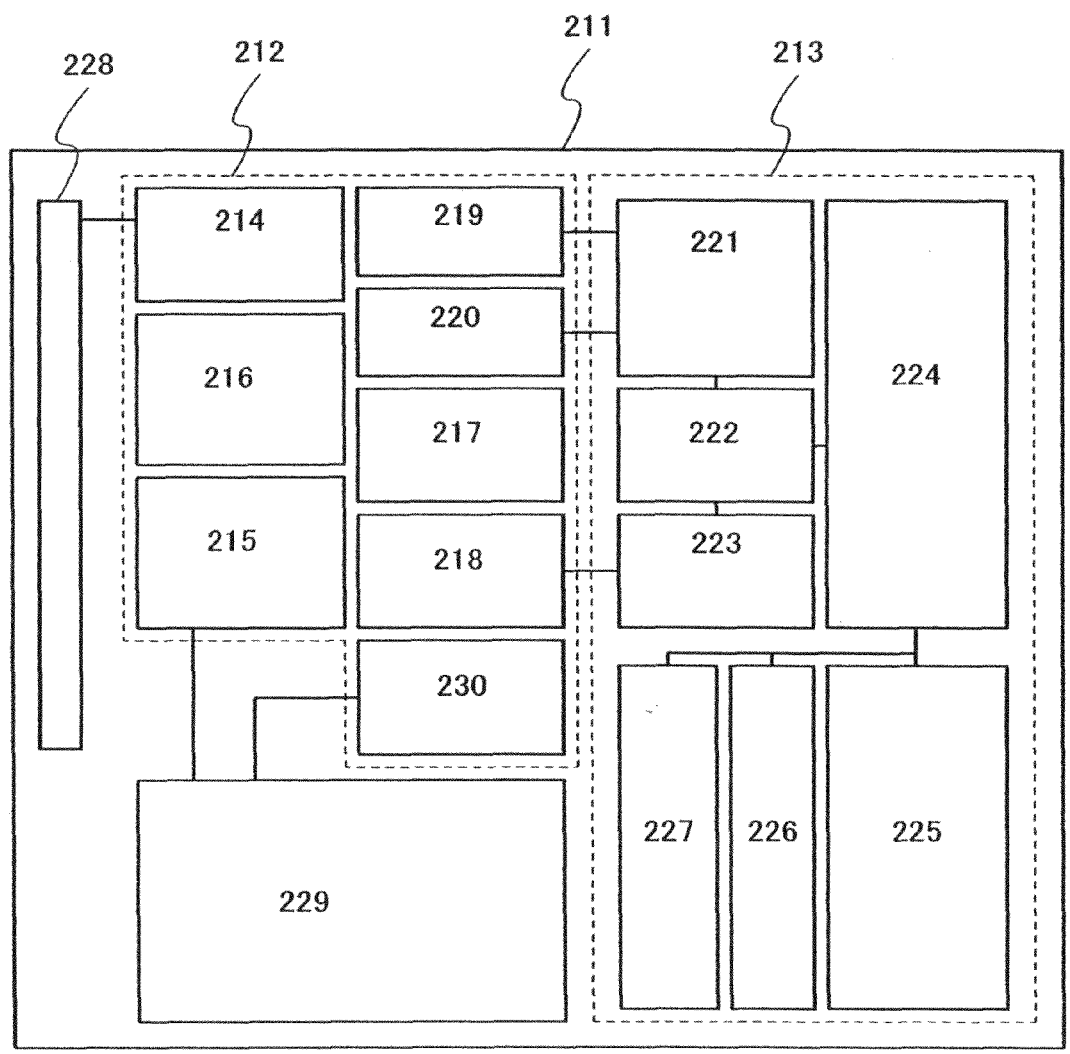
FIG. 11 is a block diagram illustrating the configuration of an RFCPU manufactured using an SOI substrate.

Described next is an example of a semiconductor device with an arithmetic function which can perform noncontact data transmission/reception. FIG. 11 is a block diagram illustrating an exemplary configuration of such a semiconductor device. The semiconductor device illustrated in FIG. 11 is a computer (hereinafter referred to as an "RFCPU") which operates through transmission and reception of signals to/from an external device by radio communication.

As illustrated in FIG. 11, an RFCPU 211 includes an analog circuit portion 212 and a digital circuit portion 213. The analog circuit portion 212 includes a resonant circuit 214 having a resonant capacitor, a rectifier circuit 215, a constant voltage circuit 216, a reset circuit 217, an oscillation circuit 218, a demodulation circuit 219, a modulation circuit 220, and a power supply control circuit 230. The digital circuit portion 213 includes an RF interface 221, a control register 222, a clock controller 223, a CPU interface 224, a central processing unit 225, a random access memory 226, and a read-only memory 227.

The operation of the RFCPU 211 with the above-described configuration is as follows. Upon receipt of a signal at the antenna 228, the resonant circuit 214 generates induced electromotive force. The induced electromotive force is stored in a capacitor portion 229 through the rectifier circuit 215. This capacitor portion 229 is preferably formed from a capacitor such as a ceramic capacitor or an electric double layer capacitor. The capacitor portion 229 does not need to be formed inside the RFCPU 211 and can be attached as a discrete part to a substrate with an insulating surface that partially constitutes the RFCPU 211.

The reset circuit 217 generates signals for resetting and initializing the digital circuit portion 213. For example, the reset circuit 217 generates a signal, which rises with delay from the time of increase in power supply voltage, as a reset signal. The oscillation circuit 218 changes the frequency and duty ratio of a clock signal based on a control signal generated by the constant voltage circuit 216. The demodulation circuit 219 is a circuit which demodulates received signals and the modulation circuit 220 is a circuit which modulates data to be transmitted.

For example, the demodulation circuit 219 is constructed from a low-pass filter and digitalizes an amplitude-shift-keying (ASK) modulated signal received, based on changes in amplitude of the signal. The modulation circuit 220 changes the amplitude of a communication signal by changing the resonance point of the resonant circuit 214 in order to transmit an ASK modulated signal whose amplitude is changed, as transmission data.

The clock controller 223 generates control signals for changing the frequency and duty ratio of clock signals based on the power supply voltage or current consumed by the central processing unit 225. The power supply voltage is monitored by the power supply control circuit 230.

A signal input to the RFCPU 211 from the antenna 228 is demodulated by the demodulation circuit 219 and decomposed into a control command, data, and the like by the RF interface 221. The control command is stored in the control register 222. Examples of the control command include a read instruction of data stored in the read-only memory 227, a write instruction of data into the random-access memory 226, and an arithmetic instruction to the central processing unit 225.

The central processing unit 225 accesses the read-only memory 227, the random access memory 226, and the control register 222 via the CPU interface 224. The CPU interface 224 has a function of generating an access signal to any of the read-only memory 227, the random access memory 226, and the control register 222 based on an address requested by the central processing unit 225.

The arithmetic method of the central processing unit 225 can be a method in which an OS (operating system) is stored in the read-only memory 227 and a program is read out and executed at the start-up time. It is also possible to use a method in which a dedicated arithmetic circuit is provided so that arithmetic processing is executed in a hardware manner. It is also possible to use a method with both hardware and software, in which a part of arithmetic processing is executed with a dedicated arithmetic circuit whereas the other part of the arithmetic processing is executed with the central processing unit 225 using a program.

Since the above-described RFCPU 211 has an integrated circuit formed from a single-crystalline semiconductor layer with uniform crystal orientation (an SOI layer) that is bonded to a substrate with an insulating surface or an insulating substrate, not only an increase in processing speed but also a reduction in power consumption can be achieved. Accordingly, long-time operation can be ensured even when the size of the capacitor portion 229 for supplying electricity is reduced.

Example 1

The present inventors have confirmed that applying laser irradiation can recover the crystallinity of a single-crystalline semiconductor layer to the same level as that of a semiconductor substrate before processed. Further, they have confirmed that the laser irradiation can planarize the surface of the single-crystalline semiconductor layer.

First, a method of manufacturing an SOI substrate in this example will be described with reference to FIGS. 12A to 12H. FIGS. 12A to 12H are cross-sectional views illustrating a method of manufacturing the SOI substrate. The SOI substrate in this example is a substrate obtained by fixing a single-crystalline layer on a glass substrate.

Figure 12A:
FIGS. 12A to 12H are cross-sectional views illustrating a method of manufacturing an SOI substrate of Example 1.

A single-crystalline silicon wafer 501 is prepared as a semiconductor substrate (see FIG. 12A). The conductivity type of the wafer is a p type, and the resistivity thereof is about 10 $\Omega \cdot$cm. In addition, the crystal orientation of the main surface is (100).

Figure 12B:
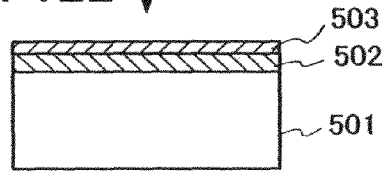

First, a silicon oxynitride film 502 with a thickness of 100 nm is formed over the top surface of the single-crystalline silicon wafer 501, and a silicon nitride oxide film 503 with a thickness of 50 nm is formed over the silicon oxynitride film 502 (see FIG. 12B). The silicon oxynitride film 502 and the silicon nitride oxide film 503 are formed by consecutively depositing two films using the same plasma CVD apparatus. The process gas of the silicon oxynitride film 502 is $SiH_4$ and $N_2O$, and the flow rates of $SiH_4$ and $N_2O$ are 4 sccm and 800 sccm, respectively. The substrate temperature at the deposition step is 400° C. The process gas of the silicon nitride oxide film 503 is $SiH_4$, $NH_3$, $N_2O$, and $H_2$, and the flow rates of $SiH_4$, $NH_3$, $N_2O$, and $H_2$ are 10 sccm, 100 sccm, 20 sccm, and 400 sccm, respectively. The substrate temperature at the deposition step is 350° C.

Figure 12C:
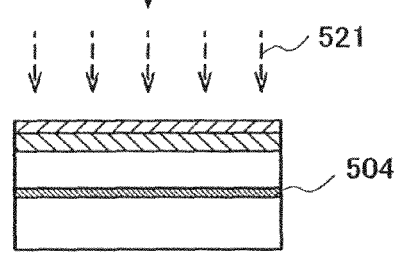
Figure 12D:
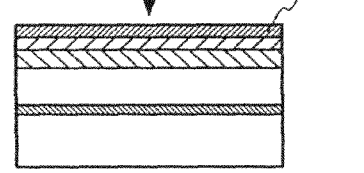

Next, in order to form an ion-implanted layer 504 in the single-crystalline silicon wafer 501, hydrogen ions 521 are implanted to the single-crystalline silicon wafer 501 using an ion doping apparatus (see FIG. 12C). A 100% hydrogen gas is used as a source gas, and the hydrogen gas is excited to generate plasma. Ions in the generated plasma are accelerated with an electric field without mass separation to irradiate the single-crystalline silicon wafer 501, whereby the ion-implanted layer 504 is formed. In this example, the implantation step of hydrogen ions is conducted twice with an accelerating voltage of 80 kV and a dosage of $1.0 \times 10^{16}$ ions/cm$^2$. By exciting the hydrogen gas in the ion doping apparatus, three kinds of ion species that are $H^+$, $H_2^+$, and $H_3^+$ are generated. All of the generated ion species are accelerated to irradiate the single-crystalline silicon wafer 501, whereby the ion-implanted layer 504 is formed.

After the formation of the ion-implanted layer 504, a silicon oxide film 505 is formed over the single-crystalline silicon wafer by plasma CVD. TEOS and $O_2$ are used as a process gas for formation of the silicon oxide film 505. The substrate temperature at the deposition step is 300° C.

Figure 12E:
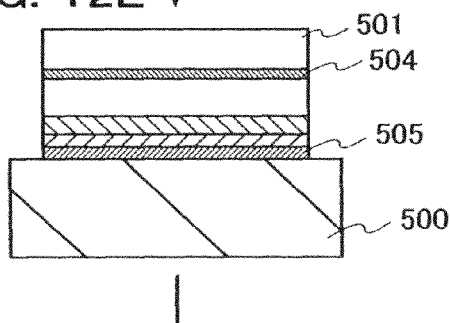

Next, a base substrate and the single-crystalline silicon wafer 501 are bonded to each other. FIG. 12E is a cross-sectional view for illustrating the bonding step. Here, a glass substrate 500 is used as the base substrate. The glass substrate 500 is an alkali-free glass substrate (product name: AN100) with a thickness of 0.7 mm. The surface of the glass substrate 500 and the silicon oxide film 505 formed on the surface of the single-crystalline silicon wafer 501 are brought into a close contact with and bonded to each other.

Figure 12F:
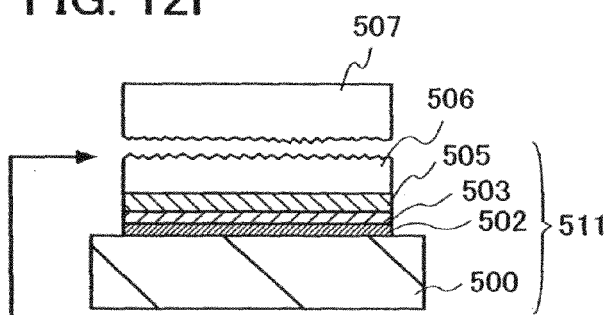

Next, the single-crystalline silicon wafer 501 bonded to the glass substrate 500 is heated at 500° C. for two hours, so that the single-crystalline silicon wafer 501 is separated along the ion-implanted layer 504 as illustrated in FIG. 12F. Accordingly, a single-crystalline silicon layer 506 remains over the glass substrate 500. The thickness of the single-crystalline silicon layer 506 is about 170 nm. The glass substrate 500 on which the single-crystalline silicon layer 506 is fixed with the films 502, 503, and 505 interposed therebetween will be referred to as an SOI substrate 511. In FIG. 12F, a single-crystalline silicon layer 507, which represents the single-crystalline silicon layer 501 separated from the glass substrate 500, is shown.

Figure 12G:
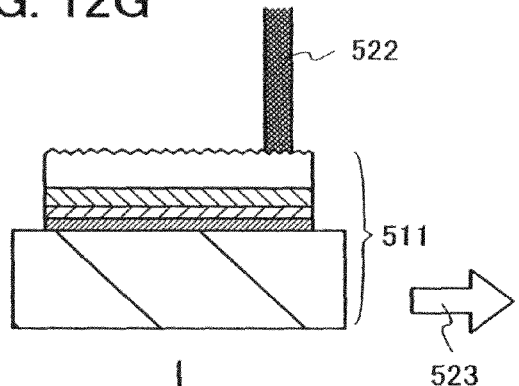

Next, the single-crystalline silicon layer 506 of the SOI substrate 511 is irradiated with a laser beam 522 as illustrated in FIG. 12G. In the laser irradiation treatment, a XeCl excimer laser which emits a beam with a frequency of 308 nm is used as a laser oscillator. The laser beam 522 has a pulse width of 25 nanoseconds and a repetition rate of 30 Hz. The laser beam on the irradiation plane is condensed into a linear beam with an optical system and the laser beam 522 scans the irradiation plane in a width direction (a short-axis direction of the beam shape). The SOI substrate 511 is set on a stage of a laser irradiation apparatus and the stage is moved such that the SOI substrate 511 is moved relative to the laser beam 522 as shown by an arrow 523, whereby the single-crystalline silicon layer 506 is scanned by the laser beam 522. Here, the scan rate of the laser beam 522 is set at 1.0 mm/sec. so that the same region of the single-crystalline silicon layer 506 is irradiated with about 12 shots of the laser beam 522.

Irradiation with the laser beam 522 is conducted in the atmospheric air or a nitrogen atmosphere. The nitrogen atmosphere is produced by irradiating the single-crystalline silicon layer 506 with the laser beam 522 in the atmospheric air and blowing nitrogen to a region of the single-crystalline silicon layer 506 which is irradiated with the laser beam 522.

Figure 12H:
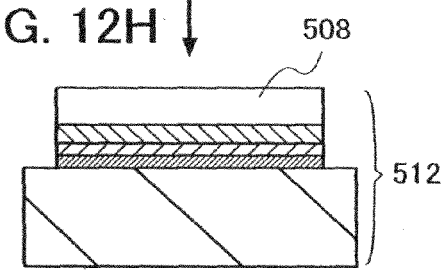

By irradiating the single-crystalline silicon layer 506 with the laser beam 522, a single-crystalline silicon layer 508 with planarity and improved crystallinity is formed (see FIG. 12H). Note that an SOI substrate 512 is the SOI substrate 511 after subjected to laser irradiation.

Described next is that the single-crystalline silicon layer 506 is recrystallized by the laser irradiation.

In this example, EBSP (electron back scatter diffraction patterns) of the surfaces of the single-crystalline silicon layer 506 not subjected to laser irradiation and the single-crystalline silicon layer 508 subjected to laser irradiation were measured. FIGS. 13A to 13C are IPF (inverse pole figure) maps obtained from the measured data.

FIG. 13A is an IPF map of the single-crystalline silicon layer 506 before subjected to laser irradiation. FIGS. 13B and 13C are IPF maps of the single-crystalline silicon layer 508 subjected to laser irradiation. Specifically, FIG. 13B shows the case where laser irradiation is conducted in the atmospheric air, and FIG. 13C shows the case where laser irradiation is conducted in a nitrogen atmosphere.

FIG. 13D is a color-code map obtained by color-coding each surface orientation of crystals, which illustrates the relationship between the colors of the IPF map and crystal orientations.

The IPF maps in FIGS. 13A to 13C show that the crystal orientation of the single-crystalline silicon layer 506 is not disordered before or after the laser irradiation, and the surface orientation of the single-crystalline silicon layer 506 remains the same as the (100) surface orientation of the single-crystalline silicon wafer 501 which has been used. In addition, FIGS. 13A to 13C can confirm that the single-crystalline silicon layer 506 has no crystal grain boundaries before or after the laser irradiation. This is because each of the IPF maps in FIGS. 13A to 13C is a square image with one color that is a color (red in the color drawing) representing the (100) orientation of the color-code map in FIG. 13D.

Note that dots that appear in the IPF maps in FIGS. 13A to 13C represent portions with a low CI value. A CI value is an index value indicating the reliability and accuracy of data that determines crystal orientation. The CI value can be low when there are crystal grain boundaries or defects of crystals. An IPF map with less portions with a low CI value can be evaluated as having a nearly perfect crystal structure and high crystallinity.

The measurement of EBSP can confirm the following: separating a single-crystalline silicon wafer whose main surface has (100) surface orientation can form the single-crystalline silicon layer 506 whose main surface has (100) surface orientation, the surface orientation of the main surface of the single-crystalline silicon layer 508 subjected to laser irradiation remains (100), and crystal grain boundaries are not formed in the single-crystalline silicon layer 508 by the laser irradiation. That is, the laser irradiation treatment is the recrystallization treatment of the single-crystalline silicon layer separated from the single-crystalline silicon wafer.

Described next is that the crystallinity of the single-crystalline silicon layer 506 can be improved by laser irradiation. Here, Raman spectroscopy was conducted to compare the crystallinity of the single-crystalline silicon layer 506 before subjected to laser irradiation and the crystallinity of the single-crystalline silicon layer 508 subjected to laser irradiation.

Figure 14A:
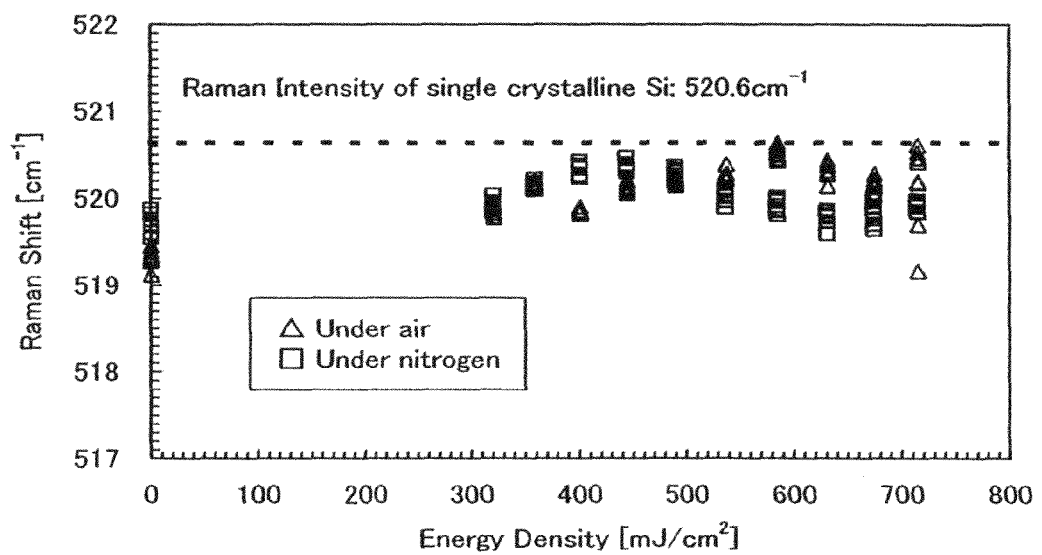
FIG. 14A is a graph showing the Raman shift peak wavenumber of single-crystalline silicon layers vs. laser energy density.
Figure 14B:
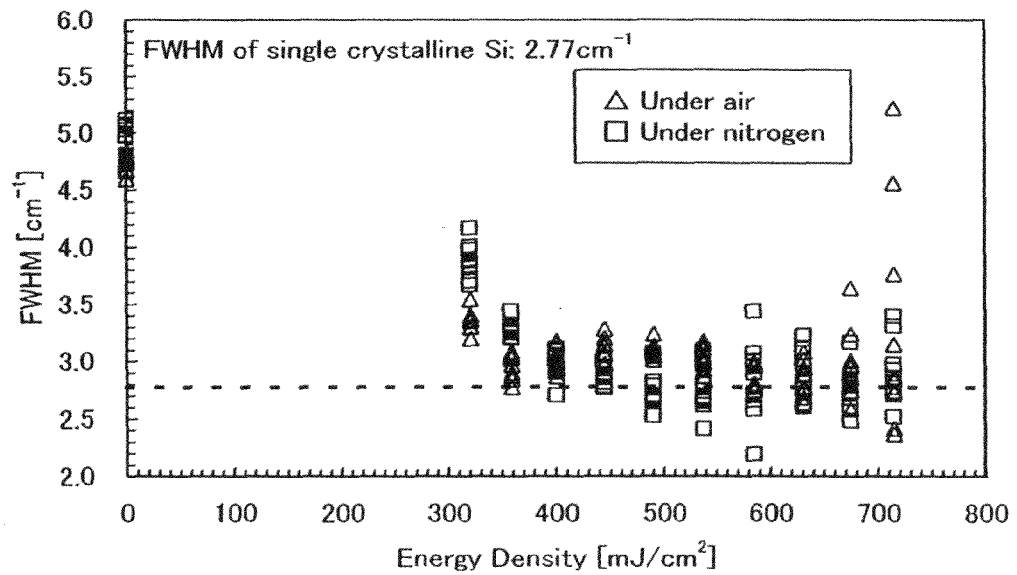
FIG. 14B is a graph showing the FWHM (full width at half maximum) of the Raman spectra of single-crystalline silicon layers vs. laser energy density.

FIG. 14A is a graph showing changes in Raman shift vs. laser energy density. FIG. 14B is a graph showing the FWHM (full width at half maximum) of the Raman spectra vs. laser energy density. Note that in FIGS. 14A and 14B, data at an energy density of 0 mJ/cm$^2$ is the measured data of the single-crystalline silicon layer 506 before subjected to laser irradiation.

The peak wavenumber (also referred to as a peak value) of Raman shift is a value determined by the oscillation mode of crystal lattices, which is peculiar to a crystal structure. Single-crystalline silicon with no internal stress has a Raman shift of 520.6 cm$^{-1}$. Therefore, in FIG. 14A, a peak value of Raman shift which is closer to 520.6 cm$^{-1}$ means that the crystal structure of the single-crystalline silicon layer 508 is closer to single-crystalline silicon and thus has good crystallinity. Note that when compressive stress is applied to single crystals, the distance between lattices becomes short and, therefore, the peak wavenumber shifts to a high wavenumber side in proportion to the magnitude of the compressive stress. On the other hand, when tensile stress is applied, the peak wavenumber shifts to a low wavenumber side in proportion to the magnitude of the stress.

In addition, in FIG. 14B, a smaller FWHM indicates more uniform crystallinity with less fluctuation of crystal state. Commercial single-crystalline silicon wafers have an FWHM of about 2.5 to 3.0 cm$^{-1}$. An FWHM closer to this value can be regarded as a barometer of a uniform crystal structure like the crystallinity of a single-crystalline silicon wafer.

The measurement results of Raman spectroscopy in FIGS. 14A and 14B can confirm that applying laser irradiation can recover the crystallinity to about the same level of crystallinity as that of the single-crystalline silicon wafer before processed.

Described next is that the surface of a single-crystalline silicon layer is planarized by laser irradiation.

In this example, the surface of a single-crystalline silicon layer of an SOI substrate was observed by taking dark-field images with an optical microscope and images with an atomic force microscope (AFM), in order to evaluate the planarity of the surface of the single-crystalline silicon layer. Single-crystalline silicon layers that were observed with each microscope include the single-crystalline silicon layer 506 before subjected to laser irradiation, the single-crystalline silicon layer 508 subjected to laser irradiation in the atmospheric air, and the single-crystalline silicon layer 508 subjected to laser irradiation in a nitrogen atmosphere. FIG. 15 shows dark-field images observed with an optical microscope and images observed with an atomic force microscope (hereinafter referred to as AFM images).

Observation of dark-field images with an optical microscope is a method in which a sample is illuminated with light in an oblique direction to observe scattered rays and diffraction rays from the sample. Therefore, when the surface of the sample is flat, the observed image is a black image (a dark image) because there is no scattering or diffraction of the illumination light. For this reason, in this example, the dark-field images are observed in order to evaluate the planarity of the single-crystalline silicon layers.

The measurement conditions in using an atomic force microscope (AFM) are as follows:

AFM: a scanning probe microscope (model: SPI3800N/SPA500) manufactured by Seiko Instruments Inc.

Measurement Mode: a dynamic force mode (DFM mode)

Cantilever: SI-DF40 (made of silicon, a spring constant of 42 N/m, a resonant frequency of 250 to 390 kHz, and a probe having a tip with a curvature of R≦10 nm)

Measured Area: 90 μm×90 μm

Measured points: 256 points×256 points

The DFM mode is a measurement mode in which a cantilever is resonated at a given frequency (a frequency peculiar to the cantilever) and the shape of the surface of a sample is measured with the distance between the probe and the sample controlled in such a manner that the oscillation amplitude of the cantilever is maintained constant. Since the surface of the sample and the cantilever are not in contact with each other in the DFM mode, it is possible to measure the surface of the sample without changing its original shape or damaging the surface.

Note that the SOI substrates 511 and 512 whose images observed with a microscope are shown in FIG. 15 are manufactured under partially different conditions from the SOI substrates 511 and 512 whose data are shown in FIGS. 13A to 14B. Here, in order to distinguish the two types of substrates, the SOI substrates 511 and 512 whose data are shown in FIG. 15 will be referred to as an SOI substrate 511-2 and an SOI substrate 512-2, respectively.

In a manufacture process of the SOI substrate 511-2, the silicon oxynitride film 502 is formed to a thickness of 50 nm in the step of FIG. 12B. In addition, in order to form the ion-implanted layer 504 in FIG. 12C, the step of adding hydrogen ions is conducted once with a hydrogen-ion accelerating voltage of 40 kV and a dosage of 1.75×10$^{16}$ ions/cm$^2$. In the step of FIG. 12F, the single-crystalline silicon wafer 501 is separated through heat treatment at 600° C. for 20 minutes and then at 650° C. for 6.5 minutes. The thickness of the single-crystalline silicon layer 506 of the SOI substrate 511-2 is about 120 nm. Note that the laser irradiation treatment in FIG. 12G is conducted in a similar way as to the SOI substrate 511 except for the energy density of laser irradiation, so that the SOI substrate 512-2 is formed. FIG. 15 shows the energy density of laser irradiation for the SOI substrate 511-2.

FIG. 15 shows the surface roughness of the single-crystalline silicon layers 506 and 508. As the surface roughness, average surface roughness $R_a$, root-mean-square roughness $R_{MS}$, and the distance between the highest and lowest points P-V (hereinafter referred to as "peak-to-valley distance P-V") are calculated. These values were calculated by analyzing the surface roughness of the AFM images shown in FIG. 15, using accessory software of the AFM.

FIG. 15 demonstrates that the single-crystalline silicon layer 506 can be planarized by laser irradiation. That is, recrystallization of the single-crystalline semiconductor layer of the SOI substrate and planarization of the surface thereof can be performed at the same time by melting the single-crystalline semiconductor layer through laser irradiation with controlled energy density. In order words, planarization of the single-crystalline silicon layer of the SOI substrate can be achieved without applying stress which could break the glass substrate or heating the glass substrate at a temperature of over its strain point.

Hereinafter, the average surface roughness $R_a$, the root-mean-square roughness $R_{MS}$, and the peak-to-valley distance P-V that are used as the indices of the planarity of a surface in this specification will be described.

The average surface roughness ($R_a$) is an index obtained by expanding the central line average surface roughness $R_a$ that is defined by JISB0601:2001 (ISO4287:1997) into three dimensions so that the index can be applied to a measured surface. $R_a$ can be expressed as the average of the absolute value of a deviation from a reference surface to a specified surface and is given by Formula (a1).

$$R_a = \frac{1}{S_0} \int_{Y_1}^{Y_2} \int_{X_1}^{X_2} |F(X, Y) - Z_0| dX dY \quad \text{(a1)}$$

A measured surface Z is a surface shown by all the measured data, and can be given by Formula (a2).

$$Z = F(X, Y) \quad \text{(a2)}$$

In addition, the specified surface is a surface whose roughness is to be measured, which is a rectangular region surrounded by four points represented by coordinates of $(X_1, Y_1), (X_1, Y_2), (X_2, Y_1)$, and $(X_2, Y_2)$. The area of the specified surface which is ideally flat is represented by $S_0$. Therefore, $S_0$ can be given by Formula (a3).

$$S_0 = (X_2 - X_1) \cdot (Y_2 - Y_1) \quad \text{(a3)}$$

In addition, the reference surface is a flat surface represented by $Z = Z_0$ where $Z_0$ represents the average value of the height of the specified surface. The reference surface is parallel with an X-Y plane. The average value $Z_0$ can be calculated from Formula (a4).

$$Z_0 = \frac{1}{S_0} \int_{Y_1}^{Y_2} \int_{X_1}^{X_2} F(X, Y) dX dY \quad \text{(a4)}$$

The root-mean-square roughness ($R_{MS}$) is an index obtained by expanding $R_{MS}$ for a profile curve into three dimensions similarly to $R_a$ so that the index can be applied to a measured surface. $R_{MS}$ can be expressed as the square root of the mean of the square of a deviation from a reference surface to a specified surface, and can be given by Formula (a5).

$$R_{ms} = \sqrt{\frac{1}{S_0} \int_{Y_1}^{Y_2} \int_{X_1}^{X_2} \{F(X, Y) - Z_0\}^2 dX dY} \quad \text{(a5)}$$

The peak-to-valley distance P-V can be expressed as a difference between a peak (the highest point) $Z_{max}$ and a valley (the lowest point) $Z_{min}$ of a specified surface, and can be given by Formula (a6).

$$P-V = Z_{max} - Z_{min} \quad \text{(a6)}$$

The peak and the valley herein are obtained by expanding the "peak" and the "valley" defined in JISB0601:2001 (ISO4287:1997) into three dimensions, and the peak is expressed as the highest point in a protrusion of a specified surface, whereas the valley is expressed as the lowest point in the specified surface.

Example 2

A method of forming an ion-implanted layer is described below in Example 2.

The formation of the ion-implanted layer is conducted by irradiation of a semiconductor substrate with accelerated ions, and the ions are derived from hydrogen (H) (hereafter referred to as "hydrogen ion species"). More specifically, a hydrogen gas or a gas which contains hydrogen in its composition is used as a source gas (a source material); a hydrogen plasma is generated by exciting the source gas; and a semiconductor substrate is irradiated with the hydrogen ion species in the hydrogen plasma. In this manner, the ion-implanted layer is formed in the semiconductor substrate.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 16:
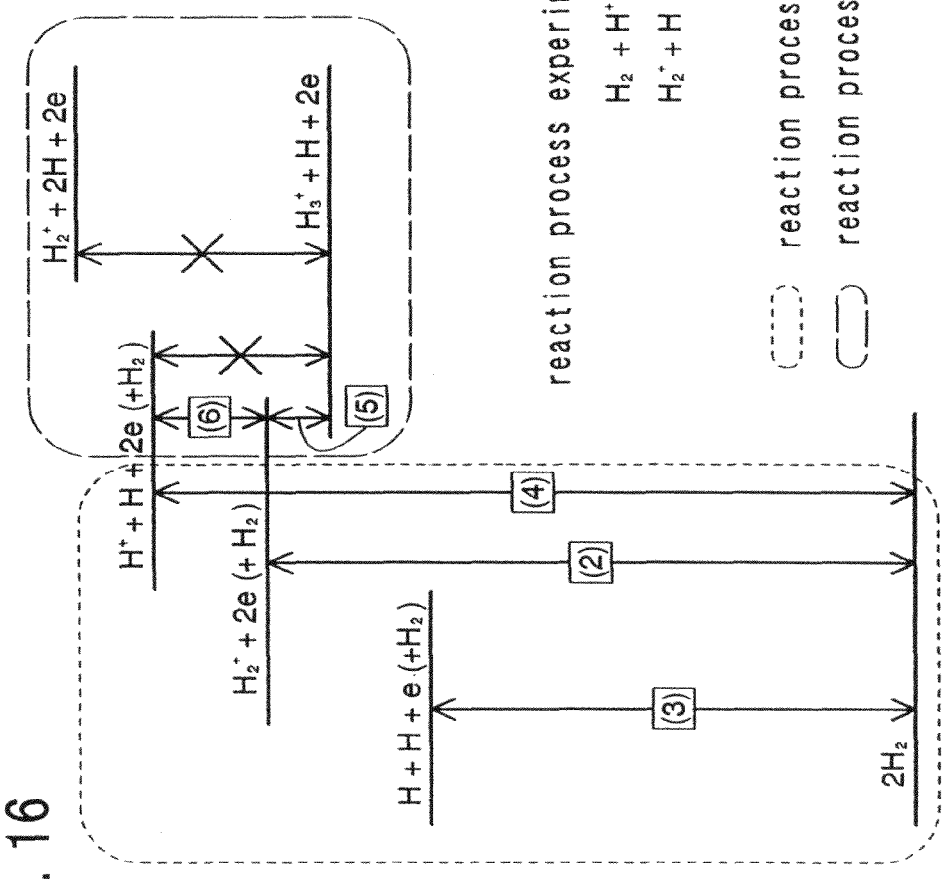
FIG. 16 is an energy diagram of hydrogen ion species.

FIG. 16 is an energy diagram which schematically shows some of the above reactions. Note that the energy diagram shown in FIG. 16 is merely a schematic diagram and does not depict the relationships of energies of the reactions exactly.

[$H_3^+$ Formation Process]

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to a potential energy that was lost by travel of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle may be high if the charged particle can gain a high amount of kinetic energy while traveling through the path. That is, it can be said that, even in the situation where the mean free path is short, the kinetic energy of a charged particle is high if the potential difference between two points is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high. In the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

[Differences Depending on Ion Source]

Figure 17:
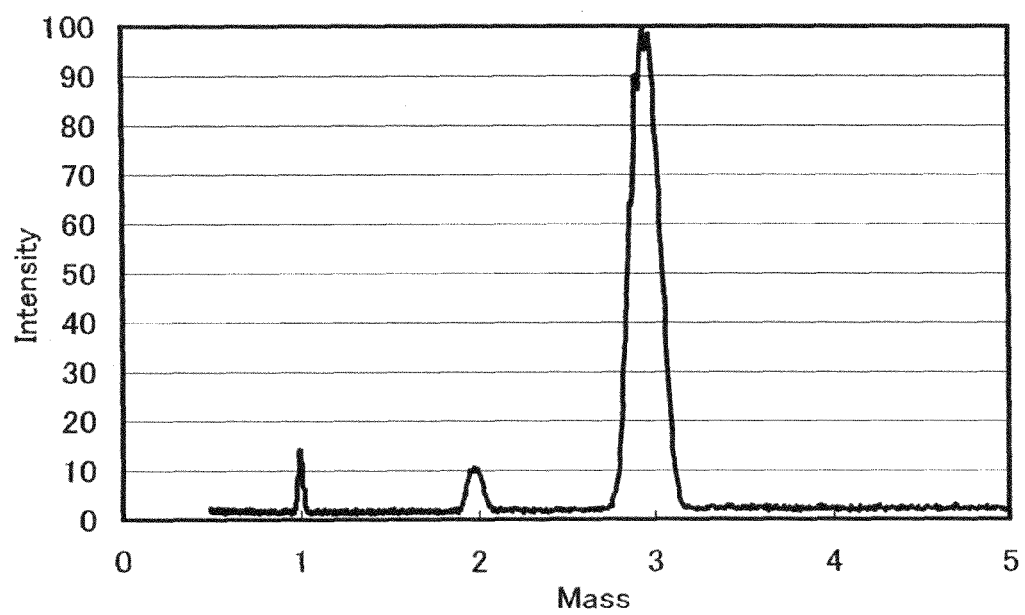
FIG. 17 is a graph showing the results of ion mass spectrometry.

Here, an example, in which the proportions of ion species (particularly, the proportion of $H_3^+$) are different, is described. FIG. 17 is a graph showing the results of mass spectrometry of ions that are generated from a 100% hydrogen gas (with the pressure of an ion source of $4.7 \times 10^{-2}$ Pa). The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 17, the number of ions with different masses is expressed as a relative proportion where the number of ions with a mass of 3 is defined as 100. It can be seen from FIG. 17 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 18:
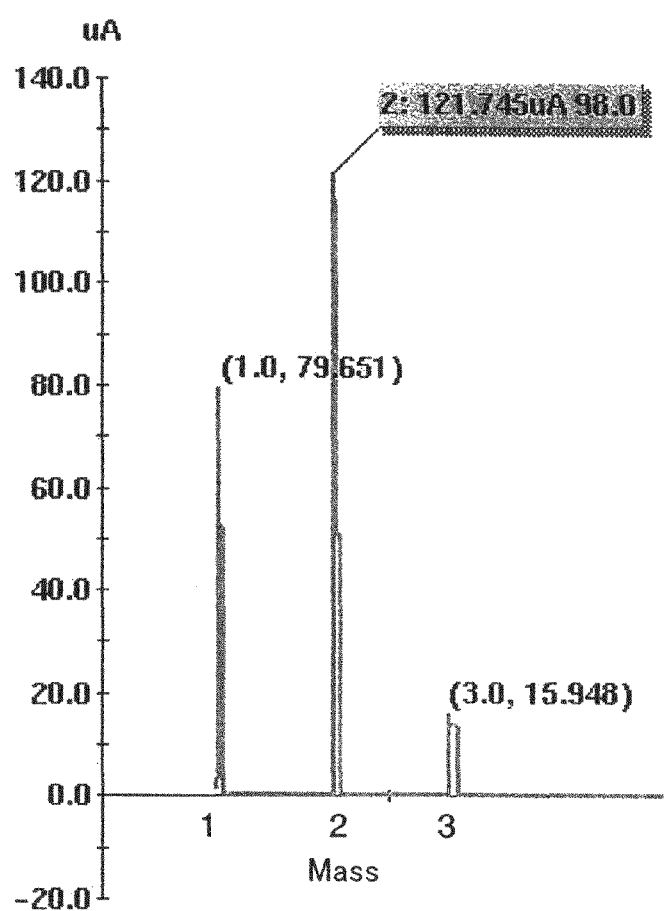
FIG. 18 is a graph showing the results of ion mass spectrometry.

FIG. 18 is a graph showing the results of mass spectrometry of ions that are generated from $PH_3$ when an ion source different from that for the case of FIG. 17 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 17, the horizontal axis of FIG. 18 represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 18 that the ratio between ion species in a plasma, i.e., the ratio between $H^+$, $H_2^+$, and $H_3^+$, is about 37:56:7. Note that, although FIG. 18 shows the data obtained when the source gas is $PH_3$, the ratio between the hydrogen ion species is almost the same when a 100% hydrogen gas is used as a source gas, as well.

In the case of the ion source from which the data shown in FIG. 18 is obtained, $H_3^+$, of $H^+$, $H_2^+$, and $H_3^+$, is generated at a proportion of only about 7%. On the other hand, in the case of the ion source from which the data shown in FIG. 17 is obtained, the proportion of $H_3^+$ can be up to 50% or higher (about 80% according to data of FIG. 17). This is thought to result from the pressure and electric field inside a chamber, which is clearly shown in the consideration of [$H_3^+$ Formation Process].

[$H_3^+$ Irradiation Mechanism]

When a plasma that contains a plurality of ion species as shown in FIG. 17 is generated and a semiconductor substrate is irradiated with the generated ion species without any mass separation being performed, the surface of the semiconductor substrate is irradiated with each of $H^+$, $H_2^+$, and $H_3^+$ ions. In order to reproduce the mechanism, from the irradiation with ions to the formation of an ion-implanted layer, the following five types of models (Models 1 to 5) are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

[Comparison of Simulation Results with Measured Values]

Based on the above models 1 to 5, the irradiation of an Si substrate with hydrogen ion species was simulated. As simulation software, SRIM (the Stopping and Range of Ions in Matter) was used. The SRIM is simulation software for ion introduction processes by a Monte Carlo method and is an improved version of TRIM (the Transport of Ions in Matter). Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Simulation results are shown below. In the simulation of this example, a calculation based on Model 2 was performed with the $H_2^+$ replaced by $H^+$ that has twice the mass. Furthermore, a calculation based on Model 3 was performed with the $H_2^+$ replaced by $H^+$ that has half the kinetic energy, a calculation based on Model 4 was performed with the $H_3^+$ replaced by $H^+$ that has three times the mass, and a calculation based on Model 5, with the $H_3^+$ replaced by $H^+$ that has one-third the kinetic energy.

Figure 19:
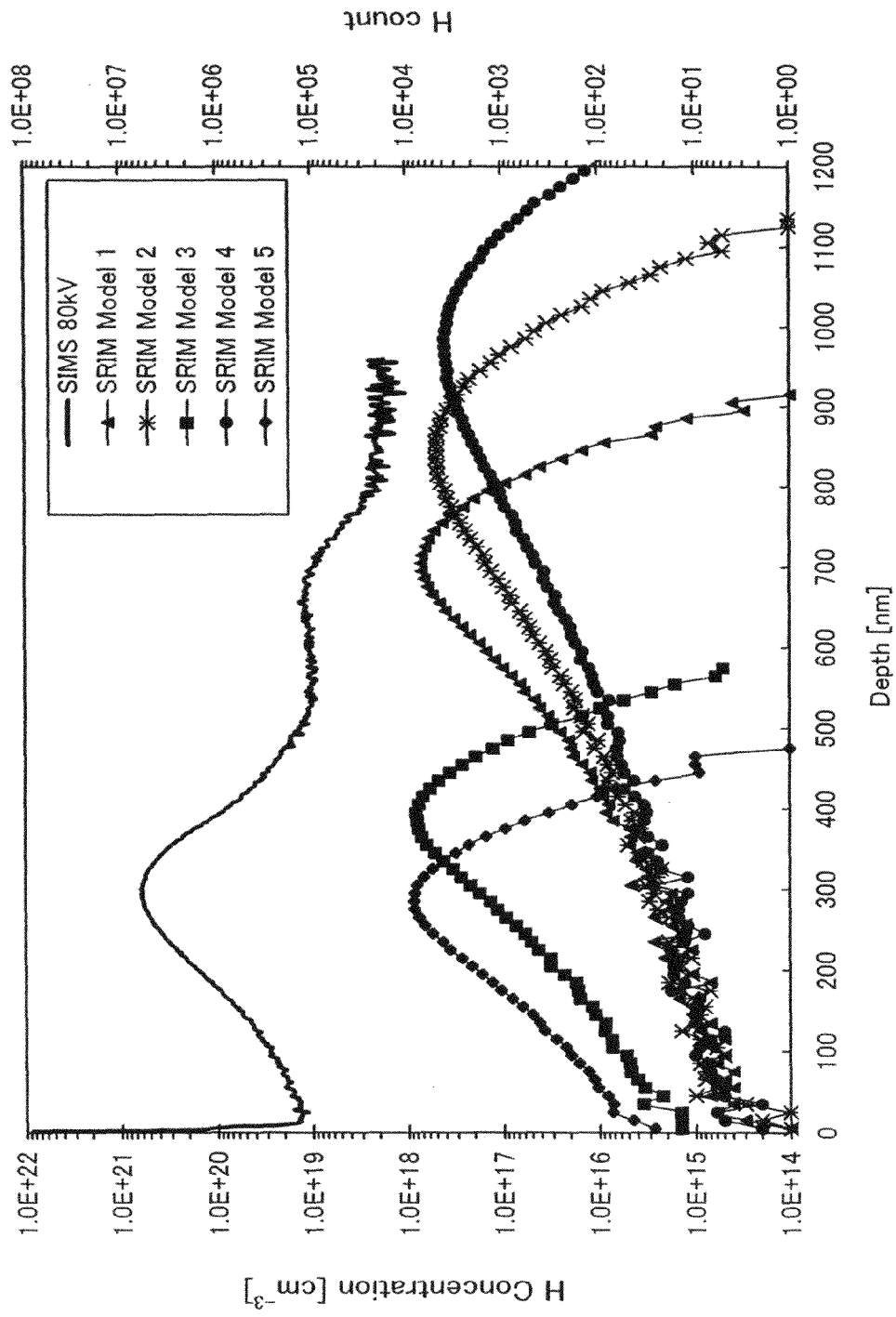
FIG. 19 is a graph showing the profile (calculated values and measured values) of hydrogen in the depth direction when the accelerating voltage is 80 kV.

Distribution of a hydrogen element (H) in a depth direction was calculated in cases where a Si substrate was irradiated with the hydrogen ion species (irradiation with 100,000 atoms for H) at accelerating voltage of 80 kV using Models 1 to 5. FIG. 19 shows the calculation results. In FIG. 19, measured values of the distribution in the depth direction of a hydrogen element (H) included in the Si substrate are also shown. The measured values are data measured by SIMS (Secondary Ion Mass Spectroscopy) (hereinafter, referred to as SIMS data). The sample measured by SIMS was a Si substrate which was irradiated with hydrogen ion species ($H^+$, $H_2^+$, $H_3^+$) produced under the conditions for measuring data of FIG. 17, at accelerating voltage of 80 kV.

In FIG. 19, the vertical axis of the graph of the measured values using the Models 1 to 5 is a right vertical axis showing the number of hydrogen atoms. The vertical axis of the graph of the SIMS data is a left vertical axis showing hydrogen concentration. The horizontal axis of the graph of the measured values and the SIMS data represents a depth from the surface of the Si substrate.

If the SIMS data, which is measured values, is compared with the calculation results, Models 2 and 4 obviously do not match the peaks of the SIMS data in the graph and a peak corresponding to Model 3 cannot be observed in the SIMS data. This shows that the contribution of each of Models 2 to 4 is comparatively smaller than those of Models 1 and 5. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Accordingly, Models 2 to 4 will not be considered hereinafter. Next are described the simulation results obtained when a Si substrate was irradiated with the hydrogen ion species (irradiation with 100,000 atoms for H) at accelerating voltage of 80 kV, 60 kV and 40 kV, using Models 1 and 5.

Figure 20:
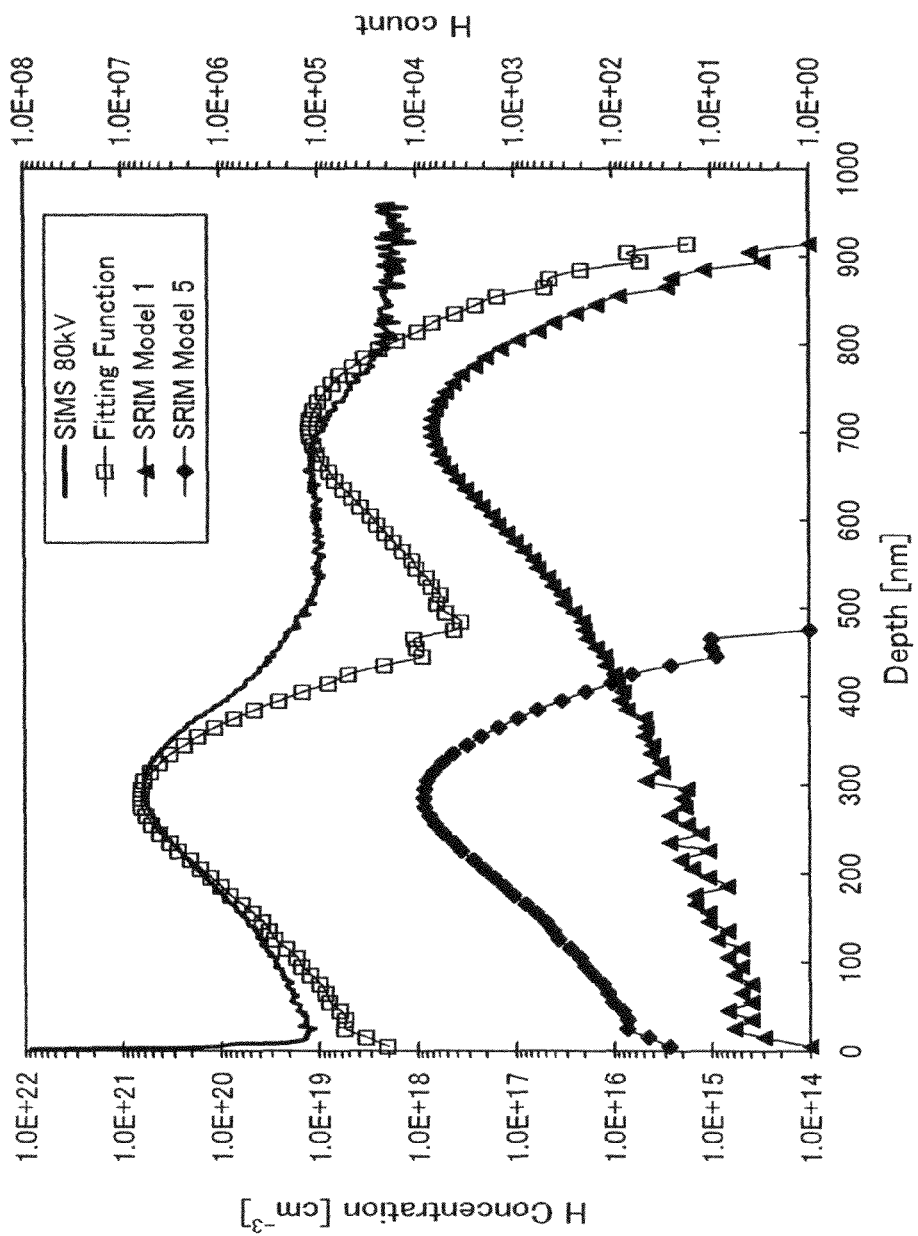
FIG. 20 is a graph showing the profile (calculated values, measured values, and fitting functions) of hydrogen in the depth direction when the accelerating voltage is 80 kV.
Figure 21:
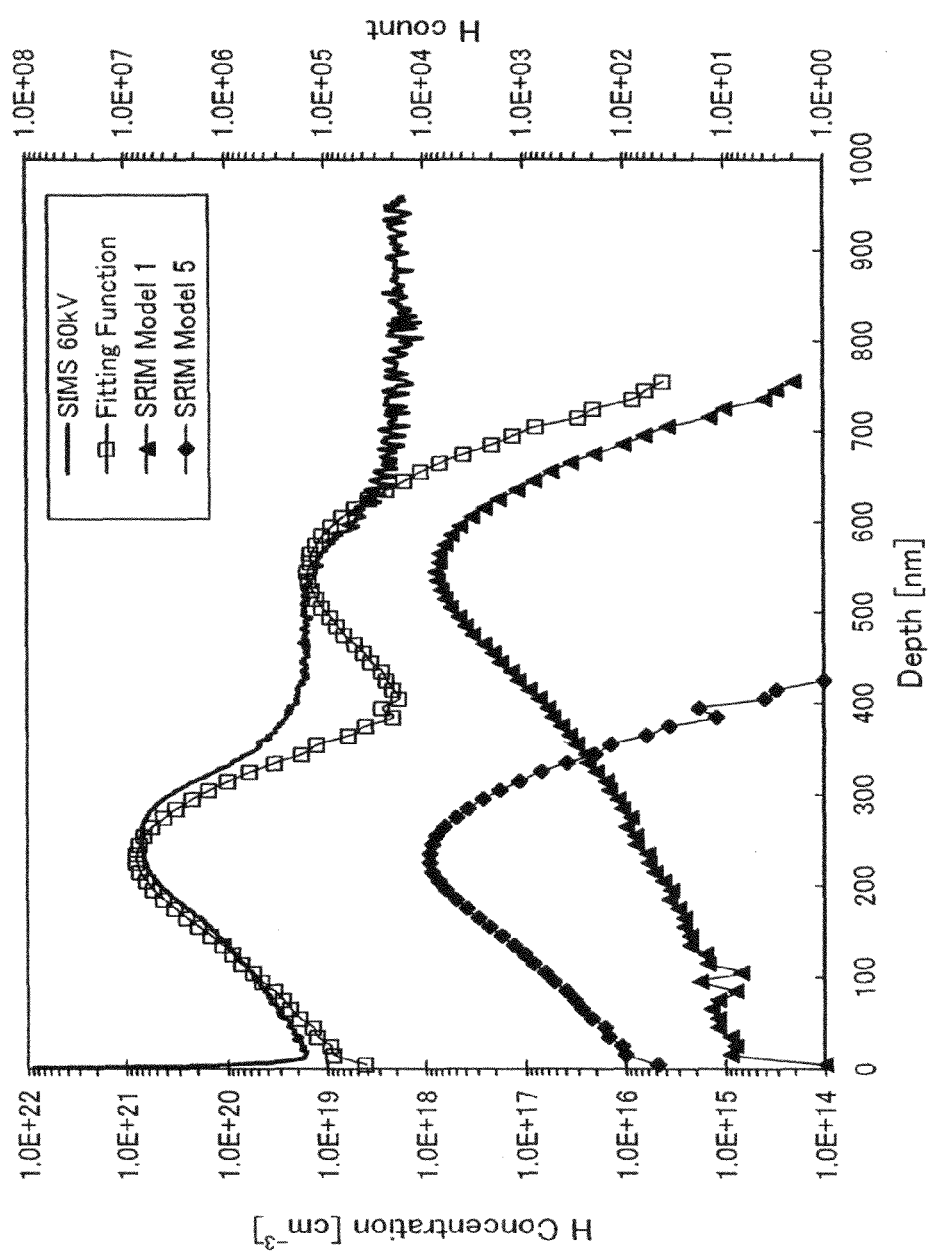
FIG. 21 is a graph showing the profile (calculated values, measured values, and fitting functions) of hydrogen in the depth direction when the accelerating voltage is 60 kV.
Figure 22:
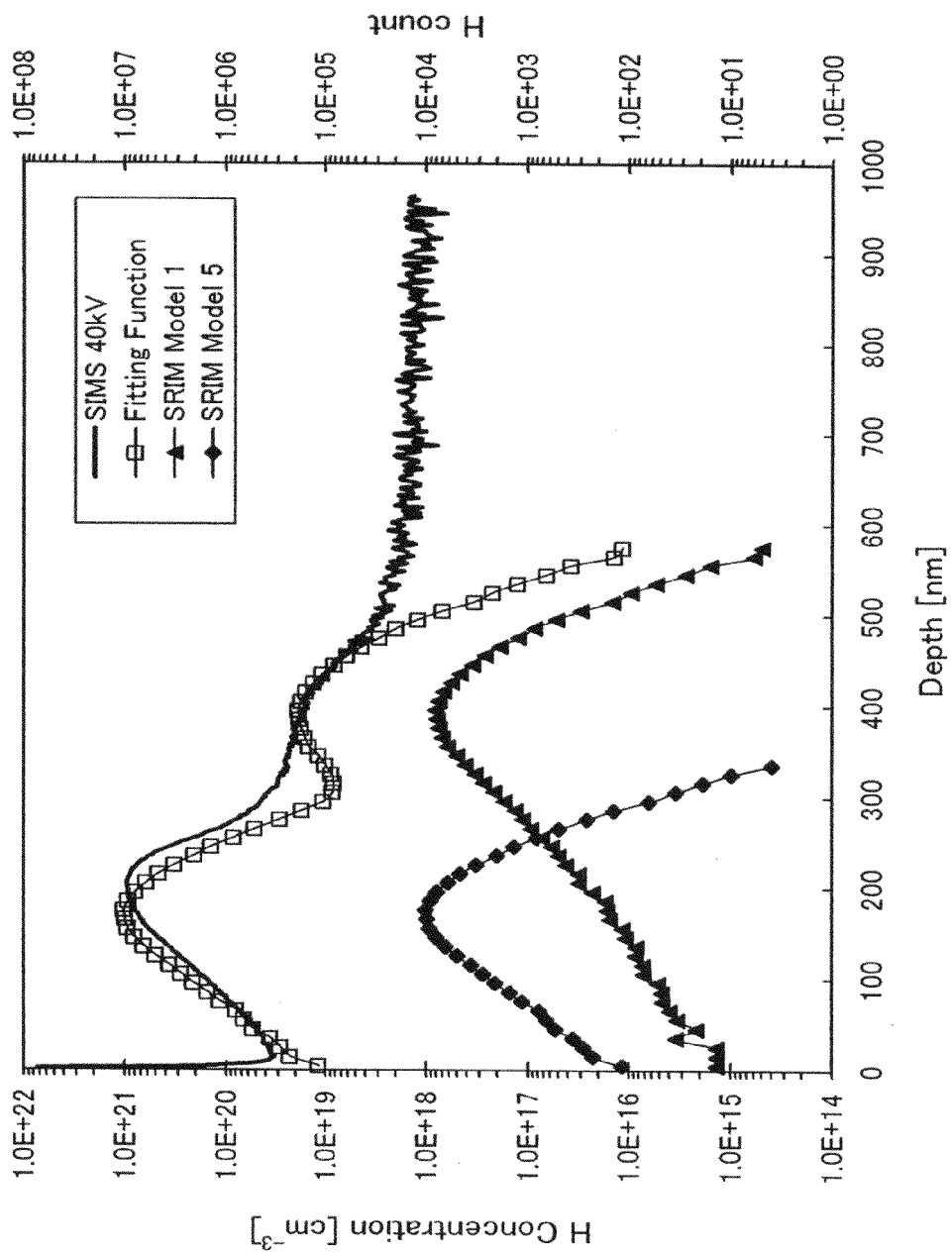
FIG. 22 is a graph showing the profile (calculated values, measured values, and fitting functions) of hydrogen in the depth direction when the accelerating voltage is 40 kV.

FIGS. 20 to 22 each show the calculation result in a depth direction of hydrogen (H) included in the Si substrate. FIG. 20 shows the case where the accelerating voltage is 80 kV; FIG. 21, the case where the accelerating voltage is 60 kV; and FIG. 22, the case where the accelerating voltage is 40 kV. Further, in FIGS. 20 to 22, SIMS data as a measured value and a fitting graph to the SIMS data (hereinafter, also referred to as a fitting function) are also shown. The sample measured by SIMS was a Si substrate which was irradiated with hydrogen ion species ($H^+$, $H_2^+$, $H_3^+$) produced under the conditions for measuring data of FIG. 17, at accelerating voltage of 80 kV, 60 kV or 40 kV. Note that the calculation values obtained using Models 1 and 5 are expressed on the vertical axis (right vertical axis) as the number of hydrogen atoms, and the SIMS data and the fitting function are expressed on the vertical axis (left vertical axis) as the concentration of hydrogen atoms. The horizontal axis represents depth from the surface of a Si substrate in the graph.

The fitting function is obtained using the calculation formula (b-1) given below, in consideration of Models 1 and 5. Note that, in the calculation formula (b-1), X and Y represent fitting parameters and V represents volume.

[Fitting Function]=$X/V$×(Data of Model 1)+$Y/V$×(Data of Model 5)  (b-1)

For determining of the fitting function, in consideration of the ratio between ion species used for actual irradiation ($H^+$:$H_2^+$:$H_3^+$ is about 1:1:8, FIG. 17), the contribution of $H_2^+$ (i.e., Model 3) should also be considered; however, the contribution of $H_2^+$ is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak corresponding to Model 3 appears in the SIMS data either, FIG. 19).

The contribution of Model 3 is likely to be obscured by channeling (movement of atoms due to crystal lattice structure) that occurs in the irradiation process of Model 5, because the peak position in the profile of Model 3 is close to that of Model 5 (FIG. 19). That is, it is difficult to estimate fitting parameters for Model 3. This is because this simulation assumes amorphous Si and the influence due to crystallinity is not considered.

FIG. 23 lists the fitting parameters of the calculation formula (b-1). At any of the accelerating voltages, the ratio of the amount of H introduced to the Si substrate according to Model 1 to that introduced according to Model 5 is about 1:42 to 1:45 (the amount of H in Model 5, when the amount of H in Model 1 is defined as 1, is about 42 to 45), and the ratio between ion species used for irradiation in the number, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that the ratio shown in FIG. 23 is close to that of the ratio between hydrogen ion species used for actual irradiation ($H^+$:$H_2^+$:$H_3^+$ is about 1:1:8, FIG. 17) is obtained.

[Effects of Use of $H_3^+$]

A plurality of benefits resulting from $H_3^+$ can be enjoyed by irradiation of a substrate with hydrogen ion species with a higher proportion of $H_3^+$ as shown in FIG. 17. For example, because $H_3^+$ splits into $H^+$, H, or the like to be introduced into a substrate, ion introduction efficiency can be improved compared with the case of irradiation mainly with $H^+$ or $H_2^+$. This leads to an improvement in SOI substrate production efficiency. In addition, because the kinetic energy of $H^+$ or H after $H_3^+$ splits similarly tends to be low, $H_3^+$ is suitable for manufacture of thin semiconductor layers.

Note that, in this example, a method is described in which an ion doping apparatus that is capable of irradiation with the hydrogen ion species as shown in FIG. 17 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, and an increase in area, a reduction in costs, and an improvement in production efficiency of SOI substrates can be obtained. On the other hand, if first priority is given to irradiation with $H_3^+$, there is no need to interpret the present invention as being limited to the use of an ion irradiation apparatus.

This application is based on Japanese Patent Application serial no. 2007-112140 filed with Japan Patent Office on Apr. 20, 2007, the entire contents of which are hereby incorporated by reference.

What is claimed is:

1. A method of manufacturing an SOI substrate, comprising the steps of:

forming an ion introduced layer in a semiconductor substrate;

forming a silicon oxide film on the semiconductor substrate by chemical vapor deposition using organic silane as a silicon source gas;

bonding the semiconductor substrate to a base substrate with the silicon oxide film interposed therebetween;

heating the semiconductor substrate to separate a part of the semiconductor substrate at the ion introduced layer, thereby, forming a semiconductor layer on the base substrate; and irradiating the semiconductor layer with a laser beam having an energy density within the range of from 300 to 750 mJ/cm$^2$ so that the semiconductor layer is melted at least partly, wherein the ion introduced layer is formed by using a halogen gas as a source gas, irradiating the semiconductor substrate with the ions generated from the halogen gas, and then using a hydrogen gas as a source gas, and irradiating the semiconductor substrate with the ions generated from the hydrogen gas.

2. The method of manufacturing an SOI substrate according to claim 1, further comprising a step of forming an insulating layer on the semiconductor substrate before forming the ion introduced layer.

3. The method of manufacturing an SOI substrate according to claim 2, wherein the insulating layer is a single-layer film including at least one of a silicon nitride film and a silicon nitride oxide film or a multi-layer film formed by stacking two or more films.

4. The method of manufacturing an SOI substrate according to claim 1, wherein the ion introduced layer is formed by exciting a source gas containing one or more gasses selected from the group consisting of a hydrogen gas, a noble gas, a halogen gas, and a halogen compound gas to generate ions and irradiating the semiconductor substrate with the ions.

5. The method of manufacturing an SOI substrate according to claim 4, wherein the ion introduced layer is formed in the semiconductor substrate before forming the silicon oxide film.

6. The method of manufacturing an SOI substrate according to claim 5, wherein a heating temperature for forming the silicon oxide film is less than or equal to 350° C. and a heating temperature for separating the part of the semiconductor substrate is more than or equal to 400° C.

7. The method of manufacturing an SOI substrate according to claim 5, wherein a heating temperature for forming the silicon oxide film is a temperature at which ions that have been introduced to the ion introduced layer do not escape, and a heating temperature for separating the part of the semiconductor substrate is a temperature at which the ions that have been introduced to the ion introduced layer escape.

8. The method of manufacturing an SOI substrate according to claim 4, wherein the ion introduced layer is formed by mass-separating the ions generated from the source gas and irradiating the semiconductor substrate with mass-separated ions.

9. The method of manufacturing an SOI substrate according to claim 1, wherein the ion introduced layer is formed by exciting a hydrogen gas to generate ions including $H_3^+$ ions and irradiating the semiconductor substrate with the ions.

10. A method of manufacturing an SOI substrate, comprising the steps of:
forming an ion introduced layer in a semiconductor substrate;
forming a bonding layer on the semiconductor substrate;
bonding the semiconductor substrate to a base substrate with the bonding layer interposed therebetween;
heating the semiconductor substrate to separate a part of the semiconductor substrate at the ion introduced layer, thereby, forming a semiconductor layer on the base substrate; and
irradiating the semiconductor layer with a laser beam having an energy density within the range of from 300 to 750 mJ/cm$^2$ so that the semiconductor layer is melted at least partly,
wherein the ion introduced layer is formed by using a halogen gas as a source gas, irradiating the semiconductor substrate with the ions generated from the halogen gas, and then using a hydrogen gas as a source gas, and irradiating the semiconductor substrate with the ions generated from the hydrogen gas, and
wherein the ions generated from the hydrogen gas include $H_3^+$ ions.

11. The method of manufacturing an SOI substrate according to claim 10, further comprising a step of forming an insulating layer on the semiconductor substrate before forming the ion introduced layer.

12. The method of manufacturing an SOI substrate according to claim 11, wherein the insulating layer is a single-layer film including at least one of a silicon nitride film and a silicon nitride oxide film or a multi-layer film formed by stacking two or more films.

13. The method of manufacturing an SOI substrate according to claim 10, wherein the ion introduced layer is formed in the semiconductor substrate before forming the bonding layer.

14. The method of manufacturing an SOI substrate according to claim 13, wherein a heating temperature for forming the bonding layer is less than or equal to 350° C. and a heating temperature for separating the part of the semiconductor substrate is more than or equal to 400° C.

15. The method of manufacturing an SOI substrate according to claim 13, wherein a heating temperature for forming the bonding layer is a temperature at which ions that have been introduced to the ion introduced layer do not escape, and a heating temperature for separating the part of the semiconductor substrate is a temperature at which the ions that have been introduced to the ion introduced layer escape.

16. The method of manufacturing an SOI substrate according to claim 10,
wherein the generated ions further include $H^+$ ions and $H_2^+$ ions, and
wherein the percentage of $H_3^+$ in the total amount of $H^+$, $H_2^+$, and $H_3^+$ is greater than or equal to 70%.

* * * * *